(12) United States Patent
Takimoto et al.

(10) Patent No.: US 11,970,152 B2
(45) Date of Patent: Apr. 30, 2024

(54) VEHICLE PEDAL STROKE DETECTION APPARATUS AND VEHICLE CONTROL UNIT

(71) Applicant: Hitachi Astemo, Ltd., Hitachinaka (JP)

(72) Inventors: Koki Takimoto, Hitachinaka (JP); Shu Kato, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 427 days.

(21) Appl. No.: 17/298,809

(22) PCT Filed: Nov. 25, 2019

(86) PCT No.: PCT/JP2019/045915
§ 371 (c)(1),
(2) Date: Jun. 1, 2021

(87) PCT Pub. No.: WO2020/116220
PCT Pub. Date: Jun. 11, 2020

(65) Prior Publication Data
US 2022/0055582 A1 Feb. 24, 2022

(30) Foreign Application Priority Data
Dec. 3, 2018 (JP) ................. 2018-226677

(51) Int. Cl.
*B60T 8/32* (2006.01)
*B60T 7/04* (2006.01)
(Continued)

(52) U.S. Cl.
CPC .............. *B60T 8/326* (2013.01); *B60T 13/62* (2013.01); *B60T 13/686* (2013.01); *B60T 17/22* (2013.01);
(Continued)

(58) Field of Classification Search
CPC .......... B60T 8/326; B60T 17/22; B60T 7/042; B60T 13/686; B60T 2220/04;
(Continued)

(56) References Cited

U.S. PATENT DOCUMENTS

2004/0020201 A1    2/2004  Feigel et al.
2017/0190328 A1*   7/2017  Nakazawa .............. B60T 7/042
(Continued)

OTHER PUBLICATIONS

German Patent No. DE 102015218992 to Stand et al published on Apr. 6, 2017.*

(Continued)

*Primary Examiner* — Pamela Rodriguez
(74) *Attorney, Agent, or Firm* — FOLEY & LARDNER LLP

(57) ABSTRACT

A vehicle pedal stroke detection apparatus acquires a first value based on a physical amount regarding a magnetic flux of a magnet that is output from a stroke sensor. The first value is a physical amount regarding a magnitude of a magnetic flux density of the magnet with respect to a displacement of a push rod. Then, the vehicle pedal stroke detection apparatus compares the first value and a second value. The second value is a preset physical amount regarding the magnitude of the magnetic flux density of the magnet with respect to the displacement of the push rod.

15 Claims, 17 Drawing Sheets

(51) Int. Cl.
    *B60T 13/62*     (2006.01)
    *B60T 13/68*     (2006.01)
    *B60T 17/22*     (2006.01)
    *G01D 5/14*     (2006.01)
    *G01L 5/22*     (2006.01)
    *G05G 1/38*     (2008.04)
    *G05G 25/00*     (2006.01)

(52) U.S. Cl.
    CPC .............. *G01D 5/142* (2013.01); *G01L 5/225* (2013.01); *G05G 1/38* (2013.01); *G05G 25/00* (2013.01); *B60T 7/042* (2013.01); *B60T 2220/04* (2013.01); *B60T 2270/402* (2013.01); *B60T 2270/404* (2013.01); *B60T 2270/82* (2013.01)

(58) Field of Classification Search
    CPC ............... B60T 13/62; B60T 2270/402; B60T 2270/404; B60T 2270/82; G05G 1/38; G05G 25/00; G01L 5/225; G01D 5/142; G01D 5/145
    See application file for complete search history.

(56) References Cited

U.S. PATENT DOCUMENTS

| 2018/0170328 | A1* | 6/2018 | Yoshizu | B60T 8/3255 |
| 2019/0232928 | A1* | 8/2019 | Adachi | B60T 11/18 |
| 2022/0205812 | A1* | 6/2022 | Kim | B60T 7/042 |

OTHER PUBLICATIONS

Korean Patent No. KR 20210076387 to Jung published on Jun. 24, 2021.*

International Search Report dated Dec. 24, 2019 issued in International Application No. PCT/JP2019/045915, with English translation, 4 pages.

Written Opinion of the International Searching Authority dated Dec. 24, 2019 issued in International Application No. PCT/JP2019/045915, with English translation, 7 pages.

* cited by examiner

VEHICLE PEDAL STROKE DETECTION APPARATUS AND VEHICLE CONTROL UNIT

TECHNICAL FIELD

The present invention relates to a vehicle pedal stroke detection apparatus and a vehicle control unit.

BACKGROUND ART

PTL 1 discloses a vehicle pedal stroke detection apparatus that detects a stroke of a brake pedal with use of a magnet provided on a piston of a master cylinder and a stroke sensor provided so as to face the magnet.

CITATION LIST

Patent Literature

PTL 1: US Patent Application Publication No. 2004/0020201

SUMMARY OF INVENTION

Technical Problem

However, the vehicle pedal stroke detection apparatus discussed in the above-described patent literature, PTL 1 detects the stroke of the magnet based on a magnetic line received by a Hall IC, and therefore the accuracy of detecting the stroke may reduce due to a shift of the relative position between the magnet and the Hall IC from a predetermined position.

Solution to Problem

One of objects of the present invention is to provide a vehicle pedal stroke detection apparatus and a vehicle control unit capable of preventing a reduction in the detection accuracy of a stroke sensor.

According to one aspect of the present invention, a vehicle pedal stroke detection apparatus acquires a first value based on a physical amount regarding a magnetic flux of a magnet that is output from a stroke sensor. The first value is a physical amount regarding a magnitude of a magnetic flux density of the magnet with respect to a displacement of a rod. Then, the vehicle pedal stroke detection apparatus compares the first value and a second value. The second value is a physical amount regarding the magnitude of the magnetic flux density of the magnet with respect to the displacement of the rod, the magnitude of the magnetic flux density of the magnet with respect to the displacement of the rod being preset.

Advantageous Effects of Invention

Therefore, according to the one aspect of the present invention, it is possible to prevent the reduction in the detection accuracy of the stroke sensor.

DESCRIPTION OF EMBODIMENTS

First Embodiment

Figure 1:
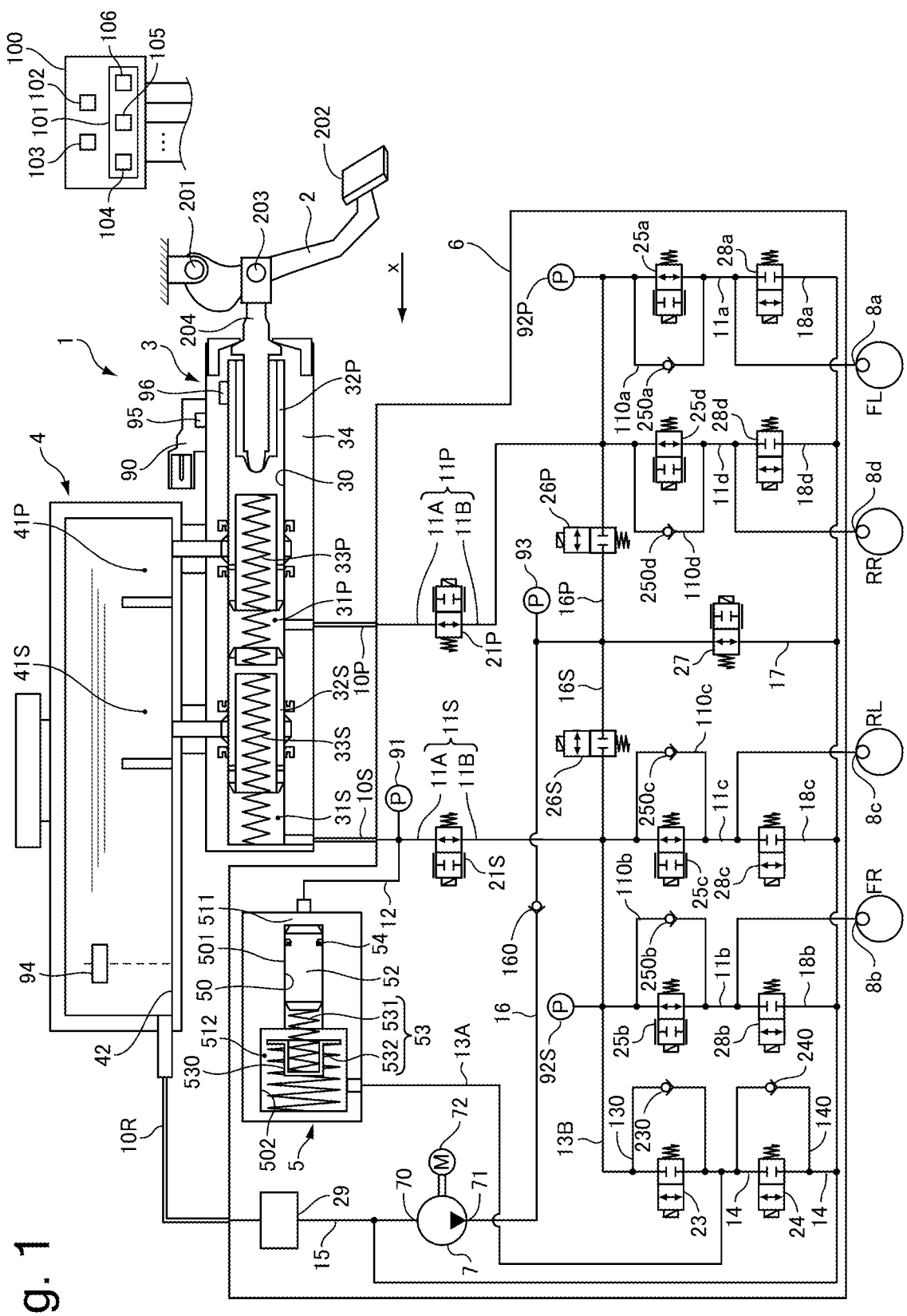
FIG. 1 schematically illustrates the configuration of a brake control apparatus 1 according to a first embodiment.

FIG. 1 schematically illustrates the configuration of a brake control apparatus 1 according to a first embodiment. The brake control apparatus 1 is a hydraulic brake control apparatus preferably usable for an electric vehicle. The electric vehicle is, for example, a hybrid automobile including a motor generator besides an engine or an electric automobile including only the motor generator as a prime mover for driving wheels. The brake control apparatus 1 may also be applied to a vehicle using only the engine as the driving force source. The brake control apparatus 1 generates a brake hydraulic pressure (a wheel cylinder hydraulic pressure Pw) by supplying brake fluid to a wheel cylinder (a braking force application portion) 8 mounted on each of wheels (a front left wheel FL, a front right wheel FR, a rear left wheel RL, and a rear right wheel RR) of the vehicle. The brake control apparatus 1 generates a frictional force by moving a frictional member with the aid of this wheel cylinder hydraulic pressure Pw and pressing the frictional member against a rotational member on the wheel side. By this operation, the brake control apparatus 1 applies a braking force to each of the wheels FL to RR. Now, the wheel cylinder 8 may be a wheel cylinder in a drum brake mechanism besides a cylinder of a hydraulic brake caliper in a disk brake mechanism. The brake control apparatus 1 includes two brake systems (brake piping), namely, a P (primary) system and an S (secondary) system, and employs, for example, an X-split piping configuration. The brake control apparatus 1 may employ another piping configuration, such as a front/rear split pipe configuration. Hereinafter, when a member provided in correspondence with the P system and a member provided in correspondence with the S system are distinguished from each other, the indexes P and S will be added at the ends of the respective reference numerals.

A brake pedal 2 is a brake operation member that receives the input of a driver's brake operation. The brake pedal 2 is a so-called suspended-type brake pedal, and the proximal end thereof is rotatably supported via a shaft 201. A pedal pad 202, which serves as a target that the driver presses, is provided at the distal end of the brake pedal 2. One end of a push rod (a rod) 204 is connected rotatably via a shaft 203 on the proximal end side of the brake pedal 2 between the shaft 201 and the pad 202.

A master cylinder 3 generates a brake hydraulic pressure (a master cylinder hydraulic pressure Pm) by being actuated by the operation performed by the driver on the brake pedal 2 (the brake operation). The brake control apparatus 1 does not include a negative-pressure booster that boosts or amplifies a brake operation force (a force F pressing the brake pedal 2) by utilizing an intake negative pressure generated by the engine of the vehicle. Therefore, the brake control apparatus 1 can be reduced in size, and is also optimal for an electric vehicle not including a negative pressure source (the engine in most cases). The master cylinder 3 is connected to the brake pedal 2 via the push rod 204, and is also replenished with the brake fluid from a reservoir tank 4.

The reservoir tank 4 is a brake fluid source that stores the brake fluid therein, and is a low-pressure portion opened to the atmospheric pressure. The bottom portion side (the vertically lower side) inside the reservoir tank 4 is partitioned (divided) into a primary hydraulic pressure chamber space 41P, a secondary hydraulic pressure chamber space 41S, and a pump intake space 42 by a plurality of partition members each having a predetermined height. A fluid level sensor 94 is set up in the reservoir tank. The fluid level sensor 94 detects the level of the brake fluid amount in the reservoir tank. The fluid level sensor 94 is used to issue a warning about a reduction in the fluid level in the reservoir tank 4. The fluid level sensor 94 includes a fixed member and a floating member. The fluid level sensor 94 detects the fluid level discretely. The fixed member is fixed to the inner wall of the reservoir tank 4, and includes a switch. The switch is provided at a position at approximately the same height as the fluid level. The floating member has buoyancy in the brake fluid, and is provided so as to be vertically movable relative to the fixed member according to an increase and a reduction in the brake fluid amount (the fluid level). When the brake fluid amount in the reservoir tank 4 reduces and the floating member moves so as to drop to a predetermined fluid level, the switch provided to the fixed member is switched from an OFF state to an ON state. By this switching, the fluid level sensor 94 detects the reduction in the fluid level. The specific configuration of the fluid level sensor 94 is not limited to the configuration that discretely detects the fluid level as described above (the switch), and may be configured to continuously detect the fluid level (analog detection).

The master cylinder 3 is a tandem-type master cylinder, and includes a primary piston 32P and a secondary piston 32S in series as master cylinder pistons axially movable according to the brake operation. The primary piston 32P is connected to the push rod 204. The secondary piston 32S is configured as a free piston. A stroke sensor 90 is provided on the master cylinder 3. The stroke sensor 90 outputs a sensor signal according to a movement amount (a stroke) of the primary piston 32P as a physical amount correlated to a displacement amount (a pedal stroke S) of the brake pedal 2 (the push rod 204). The displacement amount of the push rod 24 is approximately equal to a displacement amount of the primary piston 32P. The stroke sensor 90 is a two output-type sensor that outputs sensor signals from two systems. The pedal stroke S corresponds to a value resulting from multiplying the amount of the axial displacement of the push rod 204 or the primary piston 32P (the stroke) by a pedal ratio K of the brake pedal. K is a ratio of S to the stroke of the primary piston 32P, and is set to a predetermined value. K can be calculated based on, for example, the ratio of the distance from the shaft 201 to the pedal pad 202 to the distance from the shaft 201 to the shaft 203.

A stroke simulator 5 is actuated in reaction to the driver's brake operation. The stroke simulator 5 generates the pedal stroke S by an inflow of the brake fluid transmitted out from inside the master cylinder 3 according to the driver's brake operation into the stroke simulator 5. A piston 52 of the stroke simulator 5 is actuated axially in a cylinder 50 by the brake fluid supplied from the master cylinder 3. By this operation, the stroke simulator 5 generates an operation reaction force according to the driver's brake operation.

A hydraulic pressure unit 6 is a braking control unit capable of generating the brake hydraulic pressure independently of the brake operation performed by the driver. An electronic control unit (this is an automatic vehicle control unit and hereinafter will be referred to as an ECU) 100 is a control unit that controls the actuation of the hydraulic pressure unit 6. The hydraulic pressure unit 6 receives the supply of the brake fluid from the reservoir tank 4 or the master cylinder 3. The hydraulic pressure unit 6 is provided between the wheel cylinders 8 and the master cylinder 3, and can supply the master cylinder hydraulic pressure Pm or a control hydraulic pressure to each of the wheel cylinders 8 individually. The hydraulic pressure unit 6 includes a motor 72 of a pump (a hydraulic pressure source) 7 and a plurality of control valves (shut-off valves 21 and the like) as hydraulic devices for generating the control hydraulic pressure. The pump 7 sucks the brake fluid from a brake fluid source other than the master cylinder 3 (the reservoir tank 4 or the like), and discharges the brake fluid toward the wheel cylinders 8. The pump 7 is, for example, a plunger pump or a gear pump. The pump 7 is used in common by both the systems, and is rotationally driven by the electric motor 72 provided as the common driving source. The motor 72 is, for example, a brushed direct-current motor or a brushless motor. The shut-off valves 21 and the like perform opening/closing operations according to a control signal to switch communication states of fluid passages 11 and the like. By this operation, the hydraulic pressure unit 6 controls the flow of the brake fluid. The hydraulic pressure unit 6 can increase the pressures in the wheel cylinders 8 with use of the hydraulic pressure generated by the pump 7 with the master cylinder 3 and the wheel cylinders 8 out of communication with each other. Further, the hydraulic pressure unit 6 includes hydraulic pressure sensors 91 to 93, which detect Pm, Pw, and a discharge pressure of the pump 7, respectively.

Information input to the ECU 100 includes detected values transmitted from the stroke sensor 90 and the hydraulic pressure sensors 91 to 93, and information regarding a running state transmitted from the vehicle side. The ECU 100 performs information processing based on these various kinds of information according to a program installed therein. Further, the ECU 100 outputs an instruction signal to each of the actuators in the hydraulic pressure unit 6 according to a result of this processing, thereby controlling them. More specifically, the ECU 100 controls the opening/closing operations of the shut-off valves 21 and the like, and the number of rotations of the motor 72 (i.e., the discharge amount of the pump 7). By this control, the ECU 100 controls the wheel cylinder hydraulic pressure Pw at each of the wheels FL to RR, thereby realizing various kinds of brake control. For example, the ECU 100 realizes boosting control, anti-lock control, brake control for vehicle motion control, autonomous brake control, regenerative cooperation brake control, and the like. The boosting control assists the brake operation by generating a braking force by which the driver's brake operation force is insufficient. The anti-lock control prevents or reduces a slip (a lock tendency) of any of the wheels FL to RR that is caused from the braking. The vehicle motion control is vehicle behavior stabilization control (ESC) for preventing a sideslip and the like. The autonomous brake control is preceding vehicle following control or the like. In the regenerative cooperative brake control, the ECU 100 controls the wheel cylinder hydraulic pressures Pw so as to achieve a target deceleration (a target braking force) in cooperation with the regenerative brake.

A primary hydraulic pressure chamber 31P is defined between the two pistons 32P and 32S of the master cylinder 3. A compression coil spring 33P is set in the primary hydraulic pressure chamber 31P. A secondary hydraulic pressure chamber 31S is defined between the piston 32S and the end portion of the cylinder 30 on an x-axis positive direction. A compression coil spring 33S is set in the secondary hydraulic pressure chamber 31S. A first fluid passage (a connection fluid passage) 11 is opened to each of the hydraulic pressure chambers 31P and 31S. The hydraulic pressure chambers 31P and 31S are provided so as to be connectable to the first fluid passages 11P and 11S of the hydraulic pressure unit 6 via pipes 10P and 10S, respectively, and be communicable with the wheel cylinders 8.

The driver's operation of pressing the brake pedal 2 causes the strokes of the pistons 32, thereby generating the hydraulic pressures Pm according to reductions in the volumes of the hydraulic pressure chambers 31. Approximately equal hydraulic pressures Pm are generated in the two hydraulic pressure chambers 31P and 31S. As a result, the brake fluid is supplied from the hydraulic pressure chambers 31 toward the wheel cylinders 8 via the first fluid passages 11. The master cylinder 3 can increase the pressures in the wheel cylinders 8a and 8d of the P system via the fluid passage (the first fluid passage 11P) of the P system with use of Pm generated in the primary hydraulic pressure chamber 31P. Further, the master cylinder 3 can increase the pressures in the wheel cylinders 8b and 8c of the S system via the fluid passage (the first fluid passage 11S) of the S system with use of Pm generated in the secondary hydraulic pressure chamber 31S.

Next, the configuration of the stroke simulator 5 will be described with reference to FIG. 1. The stroke simulator 5 includes the cylinder 50, the piston 52, and a spring 53. FIG. 1 illustrates a cross-section taken along the central axis of the cylinder 50 of the stroke simulator 5. The cylinder 50 is cylindrical, and has a cylindrical inner peripheral surface. The cylinder 50 includes a piston containing portion 501 relatively small in diameter, and a spring containing portion 502 relatively large in diameter. A third fluid passage 13 (13A), which will be described below, is constantly opened on the inner peripheral surface of the spring containing portion 502. The piston 52 is installed on the inner peripheral side of the piston containing portion 501 axially movably along the inner peripheral surface thereof. The piston 52 separates the inside of the cylinder 50 into at least two chambers (a positive pressure chamber 511 and a back-pressure chamber 512). The positive pressure chamber 511 is in communication with a second fluid passage 12, and the back-pressure chamber 512 is in communication with the fluid passage 13A.

A piston seal 54 is set on the outer periphery of the piston 52 so as to extend in the direction around the central axis of the piston 52 (the circumferential direction). The piston seal 54 is in sliding contact with the inner peripheral surface of the cylinder 50 (the piston containing portion 501), and seals between the inner peripheral surface of the piston containing portion 501 and the outer peripheral surface of the piston 52. The piston seal 54 is a separation seal member that seals between the positive pressure chamber 511 and the back-pressure chamber 512 to thereby liquid-tightly separate them, and complements the function of the piston 52 as the above-described separation member. The spring 53 is a compression coil spring set in the back-pressure chamber 512, and constantly biases the piston 52 in the direction for reducing the volume of the positive pressure chamber 511. The spring 53 can generate a reaction force according to a displacement amount (a stroke) of the piston 52. The spring 53 includes a first spring 531 and a second spring 532. The first spring 531 is smaller in diameter, shorter in length, and smaller in wire diameter than the second spring 532. The spring constant of the first spring 531 is smaller than the second spring 532. The first and second springs 531 and 532 are disposed in series between the piston 52 and the cylinder 50 (the spring containing portion 502) via a retainer member 530.

Next, a hydraulic pressure circuit of the hydraulic pressure unit 6 will be described with reference to FIG. 1. Members corresponding to the individual wheels FL to RR will be distinguished from one another when necessary, by adding the indexes a to d at the ends of reference numerals thereof, respectively. The first fluid passages 11 connect the hydraulic pressure chambers 31 of the master cylinder 3 and the wheel cylinders 8 to each other. The shut-off valves 21 are normally-opened (opened when no electric power is supplied thereto) proportional control valves provided in the first fluid passages 11. The proportional control valve is an electromagnetic valve configured to be opened to a degree adjusted according to a current supplied to a solenoid. Each of the first fluid passages 11 is divided into a fluid passage 11A on the master cylinder 3 side and a fluid passage 11B on the wheel cylinder 8 side by the shut-off valve 21. Solenoid IN valves (SOL/V INs) 25 are normally-opened proportional valves provided in correspondence with the individual wheels FL to RR (fluid passages 11a and 11d) on the wheel cylinder 8 side (the fluid passages 11B) with respect to the shut-off valves 21 in the first fluid passages 11. A bypass fluid passage 110 is provided in parallel with the first fluid passage 11 while bypassing the SOL/V IN 25. A check valve 250 is provided in the bypass fluid passage 110. The check valve 250 permits only a flow of the brake fluid from the wheel cylinder 8 side toward the master cylinder 3 side.

An intake fluid passage 15 connects an internal fluid pool 29 and an intake port 70 of the pump 7 to each other. The internal fluid pool 29 is connected to the reservoir tank 4 (the pump intake space 42) via an intake pipe 10R. A discharge fluid passage 16 connects a discharge portion 71 of the pump 7 and a portion in the first fluid passage 11B between the shut-off valve 21 and the SOL/V IN 25. A check valve 160 is provided in the discharge fluid passage 16, and permits only a flow from one side where the discharge portion 71 of the pump 7 is located (the upstream side) to the other side where the first fluid passages 11 are located (the downstream side). The check valve 160 is a discharge valve provided to the pump 7. The discharge fluid passage 16 branches into a fluid passage 16P of the P system and a fluid passage 16S of the S system on the downstream side of the check valve 160. The individual fluid passages 16P and 16S are connected to the first fluid passage 11P of the P system and the first fluid passage 11S of the S system, respectively. The fluid passages 16P and 16S connect the first fluid passages 11P and 11S to each other. A communication valve 26P is a normally-closed (closed when no electric power is supplied thereto) ON/OFF valve provided in the fluid passage 16P. The ON/OFF valve is an electromagnetic valve that is switched and controlled so as to be either opened or closed in a binary manner. A communication valve 26S is a normally-closed ON/OFF valve provided in the fluid passage 16S. The pump 7 is a second hydraulic pressure source capable of generating the wheel cylinder hydraulic pressures Pw by generating hydraulic pressures in the first fluid passages 11 with use of the brake fluid supplied from the reservoir tank 4. The pump 7 is connected to the wheel cylinders 8a to 8d via the above-described communication fluid passages (the discharge fluid passages 16P and 16S) and the first fluid passages 11P and 11S, and can increase the pressures in the wheel cylinders 8 by discharging the brake fluid to the communication fluid passages (the discharge fluid passages 16P and 16S).

A first pressure reduction fluid passage 17 connects a portion in the discharge fluid passage 16 between the check valves 160 and the communication valves 26, and the intake fluid passage 15 to each other. A pressure adjustment valve 27 is a normally-opened proportional control valve provided in the first pressure reduction fluid passage 17. The pressure adjustment valve 27 may be a normally-closed valve. Second pressure reduction fluid passages 18 connect the wheel cylinder 8 side of the first fluid passages 11B with respect to the SOL/INs 25, and the intake fluid passage 15 to each other. Solenoid OUT valves (SOL/V OUTs) 28 are normally-closed ON/OFF valves provided in the second pressure reduction fluid passages 18 as second pressure reduction valves.

The second fluid passage 12 branches off from the first fluid passage 11A of the S system to be connected to the stroke simulator 5. The second fluid passage 12 connects the secondary hydraulic pressure chamber 31S of the master cylinder 3 and the positive pressure chamber 511 of the stroke simulator 5 to each other, together with the first fluid passage 11A. The third fluid passage 13 connects the back-pressure chamber 512 of the stroke simulator 5 and the first fluid passage 11B of the S system to each other. More specifically, the third fluid passage 13 branches off from a portion in the first fluid passage 11S (the fluid passage 11B) between the shut-off valve 21S and the SOL/V IN 25, and is connected to the back-pressure chamber 512. A stroke simulator IN valve SS/V IN 23 is a normally-closed ON/OFF valve provided in the third fluid passage 13. The third fluid passage 13 is divided into the fluid passage 13A on the back-pressure chamber 512 side and a fluid passage 13B on the first fluid passage 11 side by the SS/V IN 23. A bypass fluid passage 130 is provided in parallel with the third fluid passage 13 while bypassing the SS/V IN 23. The bypass fluid passage 130 connects the fluid passage 13A and the fluid passage 13B to each other. A check valve 230 is provided in the bypass fluid passage 130. The check valve 230 permits a flow of the brake fluid heading from the back-pressure chamber 512 side (the fluid passage 13A) toward the first fluid passage 11 side (the fluid passage 13B), and prohibits a flow of the brake fluid in the opposite direction therefrom.

A fourth fluid passage 14 connects the back-pressure chamber 512 of the stroke simulator 5 and the reservoir tank 4 to each other. The fourth fluid passage 14 connects a portion in the third fluid passage 13 between the back-pressure chamber 512 and the SS/V IN 23 (the fluid passage 13A), and the intake fluid passage 15 (or the first pressure reduction fluid passage 17 on the intake fluid passage 15 side with respect to the pressure adjustment valve 27, and the second pressure reduction fluid passages 18 on the intake fluid passage 15 side with respect to the SOL/V OUTs 28). The fourth fluid passage 14 may be directly connected to the back-pressure chamber 512 or the reservoir tank 4. A stroke simulator OUT valve (a simulator cutoff valve) SS/V OUT 24 is a normally-closed ON/OFF valve provided in the fourth fluid passage 14. A bypass fluid passage 140 is provided in parallel with the fourth fluid passage 14 while bypassing the SS/V OUT 24. A check valve 240 is provided in the bypass fluid passage 140. The check valve 240 permits a flow of the brake fluid heading from the reservoir tank 4 (the intake fluid passage 15) side toward the third fluid passage 13A side, i.e., toward the back-pressure chamber 512 side, and prohibits a flow of the brake fluid in the opposite direction therefrom.

The hydraulic pressure sensor 91 is provided in the first fluid passage 11S between the shut-off valve 21S and the master cylinder 3 (the fluid passage 11A). The hydraulic pressure sensor 91 detects the hydraulic pressure at this portion (the master cylinder hydraulic pressure Pm and the hydraulic pressure in the positive pressure chamber 511 of the stroke simulator 5). The hydraulic pressure sensors 92 are provided between the shut-off valves 21 and the SOL/V INs 25 in the first fluid passages 11. The hydraulic pressure sensors 92 detect the hydraulic pressures at these portions (the wheel cylinder hydraulic pressures Pw). The hydraulic pressure sensor 93 is provided in a portion of the discharge fluid passage 16 between the discharge portion 71 of the pump 7 (the check valve 160) and the communication valves 26. The hydraulic pressure senor 93 detects the hydraulic pressure at this portion (the pump discharge pressure).

A first system is formed by the brake system (the first fluid passages 11) that connects the hydraulic pressure chambers 31 of the master cylinder 3 and the wheel cylinders 8 to each other with the shut-off valves 21 controlled in the valve-opening directions. This first system can realize pressing force brake (non-boosting control) by generating the wheel cylinder hydraulic pressures Pw from the master cylinder hydraulic pressures Pm generated with use of the pressing force F. On the other hand, a second system is formed by the brake system (the intake fluid passage 15, the discharge fluid passage 16, and the like) that includes the pump 7 and connects the reservoir tank 4 and the wheel cylinders 8 to each other with the shut-off valves 21 controlled in the valve-closing directions. This second system constructs a so-called brake-by-wire device, which generates the wheel cylinder hydraulic pressures Pw from the hydraulic pressure generated with use of the pump 7, and can realize the boosting control and the like as brake-by-wire control. At the time of the brake-by-wire control (hereinafter simply referred to as by-wire control), the stroke simulator 5 generates an operation reaction force according to the driver's brake operation.

The ECU 100 includes a by-wire control portion 101, a pressing force brake portion 102, and a fail-safe portion 103. The by-wire control portion 101 closes the shut-off valves 21 to increase the pressures in the wheel cylinders 8 by the pump 7 according to the state of the driver's brake operation. The by-wire control portion 101 includes a brake operation state detection portion 104, a target wheel cylinder hydraulic pressure calculation portion 105, and a wheel cylinder hydraulic pressure control portion 106.

The brake operation state detection portion 104 detects the pedal stroke S as a brake operation amount input by the driver upon receiving the input of the value detected by the stroke sensor 90. Further, the brake operation state detection portion 104 detects whether the driver is performing the brake operation (whether the brake pedal 2 is being operated) based on the pedal stroke S. The master cylinder 3, the first fluid passages 11, the shut-off valves 21, the pump 7, a magnet 96, the stroke sensor 90, and the ECU 100 form a vehicle pedal stroke detection apparatus.

The target wheel cylinder hydraulic pressure calculation portion 105 calculates a target wheel cylinder hydraulic pressure Pw*. For example, at the time of the boosting control, the target wheel cylinder hydraulic pressure calculation portion 105 calculates the target wheel cylinder hydraulic pressure Pw* that realizes an ideal relationship between S and a brake hydraulic pressure requested by the driver (a vehicle deceleration requested by the driver) according to a predetermined boosting ratio based on the detected pedal stroke S (the brake operation amount). For example, the above-described ideal relationship for calculating the target wheel cylinder hydraulic pressure Pw* is defined to be a predetermined relationship between the pedal stroke S and the wheel cylinder hydraulic pressure Pw (the braking force) that would be realized when a brake control apparatus including a negative-pressure booster normal in size actuates the negative-pressure booster.

The wheel cylinder hydraulic pressure control portion 106 controls the shut-off valves 21 in the valve-closing directions, thereby bringing the hydraulic pressure unit 6 into a state capable of generating the wheel cylinder hydraulic pressures Pw with use of the pump 7 (the second system) (pressure increase control). The wheel cylinder hydraulic pressure control portion 106 controls each of the actuators in the hydraulic pressure unit 6 in this state, thereby performing hydraulic pressure control (for example, the boosting control) that realizes the target wheel cylinder hydraulic pressure Pw*. More specifically, the wheel cylinder hydraulic pressure control portion 106 controls the shut-off valves 21 in the valve-closing directions, the communication valves 26 in the valve-opening directions, and the pressure adjustment valve 27 in the valve-closing direction, and also actuates the pump 7. Controlling each of the actuators in this manner allows desired brake fluid to be transmitted from the reservoir tank 4 side to the wheel cylinders 8 via the intake fluid passage 15, the pump 7, the discharge fluid passage 16, and the first fluid passages 11. The brake fluid discharged from the pump 7 flows into the first fluid passages 11B via the discharge fluid passage 16. The pressure in each of the wheel cylinders 8 is increased due to an inflow of this brake fluid into each of the wheel cylinders 8. In other words, the pressure in each of the wheel cylinders 8 is increased with use of the hydraulic pressure generated in the first fluid passage 11B with use of the pump 7. At this time, the desired braking force can be acquired by performing feedback control on the number of rotations of the pump 7 and the valve-opening state (the opening degree and/or the like) of the pressure adjustment valve 27 so that the value detected by the hydraulic pressure sensor 92 becomes closer to the target wheel cylinder hydraulic pressure Pw*. More specifically, the wheel cylinder hydraulic pressures Pw can be adjusted by controlling the valve-opening state of the pressure adjustment valve 27 and allowing the brake fluid to leak from the discharge fluid passage 16 or the first fluid passages 11 to the intake fluid passage 15 via the pressure adjustment valve 27 as appropriate.

In the first embodiment, the wheel cylinder hydraulic pressures Pw are controlled basically by changing the valve-opening state of the pressure adjustment valve 27 instead of the number of rotations of the pump 7 (the motor 72). In this case, controlling the shut-off valves 21 in the valve-closing directions and blocking the communication between the master cylinder 3 side and the wheel cylinder 8 side facilitates the control of the wheel cylinder hydraulic pressures Pw independently of the driver's brake operation. Further, the SS/V OUT 24 is controlled in the valve-opening direction. As a result, the communication is established between the back-pressure chamber 512 of the stroke simulator 5 and the intake fluid passage 15 (the reservoir tank 4) side. Therefore, when the brake fluid is discharged from the master cylinder 3 according to the operation of pressing the brake pedal 2, and this brake fluid flows into the positive pressure chamber 511 of the stroke simulator 5, the piston 52 is actuated. As a result, the pedal stroke Sp is generated. The brake fluid flows out from the back-pressure chamber 512 by a fluid amount equivalent to the fluid amount flowing into the positive pressure chamber 511. This brake fluid is discharged toward the intake fluid passage 15 (the reservoir tank 4) side via the third fluid passage 13A and the fourth fluid passage 14. The fourth fluid passage 14 only has to be connected to a low-pressure portion into which the brake fluid can flow, and does not necessarily have to be connected to the reservoir tank 4. Further, the operation reaction force applied to the brake pedal 2 (the pedal reaction force) is generated due to the force with which the piston 52 is pressed by the spring 53 of the stroke simulator 5, the hydraulic pressure in the back-pressure chamber 512, and the like. In other words, the stroke simulator 5 generates the characteristic of the brake pedal 2 (the F-S characteristic, which is the relationship of S to F) at the time of the by-wire control.

The pressing force brake portion 102 opens the shut-off valves 21, thereby increasing the pressures in the wheel cylinders 8 with use of the master cylinder 3. The pressing force brake portion 102 controls the shut-off valves 21 in the valve-opening directions, thereby bringing the hydraulic pressure unit 6 into a state capable of generating the wheel cylinder hydraulic pressures Pw from the master cylinder pressures Pm (the first system), thus realizing the pressing force brake. At this time, the pressing force brake portion 102 controls the SS/V OUT 24 in the valve-closing direction, thereby making the stroke simulator 5 inactive in reaction to the driver's brake operation. As a result, the brake fluid is efficiently supplied from the master cylinder 3 toward the wheel cylinders 8. This can prevent a reduction in the wheel cylinder hydraulic pressures Pw that the driver generates with the pressing force F. More specifically, the pressing force brake portion 102 brings all of the actuators in the hydraulic pressure unit 6 into the deactivated state. The SS/V IN 23 may be controlled in the opening direction.

The fail-safe portion 103 detects occurrence of an abnormality (a failure or a malfunction) in the brake control apparatus 1. For example, the fail-safe portion 103 detects a failure in the actuator (the pump 7, the motor 72, the pressure adjustment valve 27, or the like) in the hydraulic pressure unit 6 based on a signal from the brake operation state detection portion 104 and the signal from each of the sensors. Alternatively, the fail-safe portion 103 detects an abnormality in an in-vehicle power source (a battery) that supplies electric power to the brake control apparatus 1, or the ECU 100. When detecting the occurrence of an abnormality during the by-wire control, the fail-safe portion 103 switches the control according to the state of the abnormality. For example, when the hydraulic pressure control based on the by-wire control is determined to be unable to continue, the fail-safe portion 103 actuates the pressing force brake portion 102, thereby switching the control from the by-wire control to the pressing force control. More specifically, the fail-safe portion 103 brings all of the actuators in the hydraulic pressure unit 6 into the deactivated state, thereby causing the braking to transition to the pressing force brake. Then, the shut-off valves 21 are normally-opened valves, and therefore are kept opened when a failure has occurred in the electric power source, thereby allowing the pressing force brake to be automatically realized. Further, the SS/V OUT 24 is a normally-closed valve, and therefore is closed when a failure has occurred in the electric power source, thereby allowing the stroke simulator 5 to be automatically deactivated. Further, the communication valves 26 are normally-closed valves, and therefore allow the brake hydraulic pressure systems of the two systems to operate independently of each other when a failure has occurred in the electric power source, thereby allowing these systems to increase the pressures in the wheel cylinders based on the pressing force F separately from each other.

Further, the fail-safe portion 103 performs an operation for detecting one of the two brake systems in which a fluid leak failure has occurred (a fluid leak system) when the fluid level sensor 94 detects a reduction in the fluid level in the reservoir tank. In the brake system, a fluid leak occurs in, for example, the brake pipe connecting the housing of the hydraulic pressure unit 6 and the wheel cylinders 8, but the hydraulic pressure in the brake system also reduces due to, for example, the SOL/V OUT 28 stuck in the opened state. Therefore, in the first embodiment, assume that the reduction in the hydraulic pressure due to, for example, the SOL/V OUT 28 stuck in the opened state is also handled as a fluid leak in the brake system. The by-wire control portion 101 performs the by-wire control with use of only the brake system where the fluid leak failure has not occurred (the normal system) when the fail-safe portion 103 detects the fluid leak system (this control will be referred to as single-system boosting control). In the single-system boosting control, although the shut-off valves 21, the pressure adjustment valve 27, and the pump 7 operate in a similar manner to the normal control (the normal by-wire control), the communication valve 26 on the fluid leak system side is closed and the communication fluid passage on the fluid leak system side is blocked. By this control, the wheel cylinder hydraulic pressures Pw in the normal system can be controlled.

Figure 2:
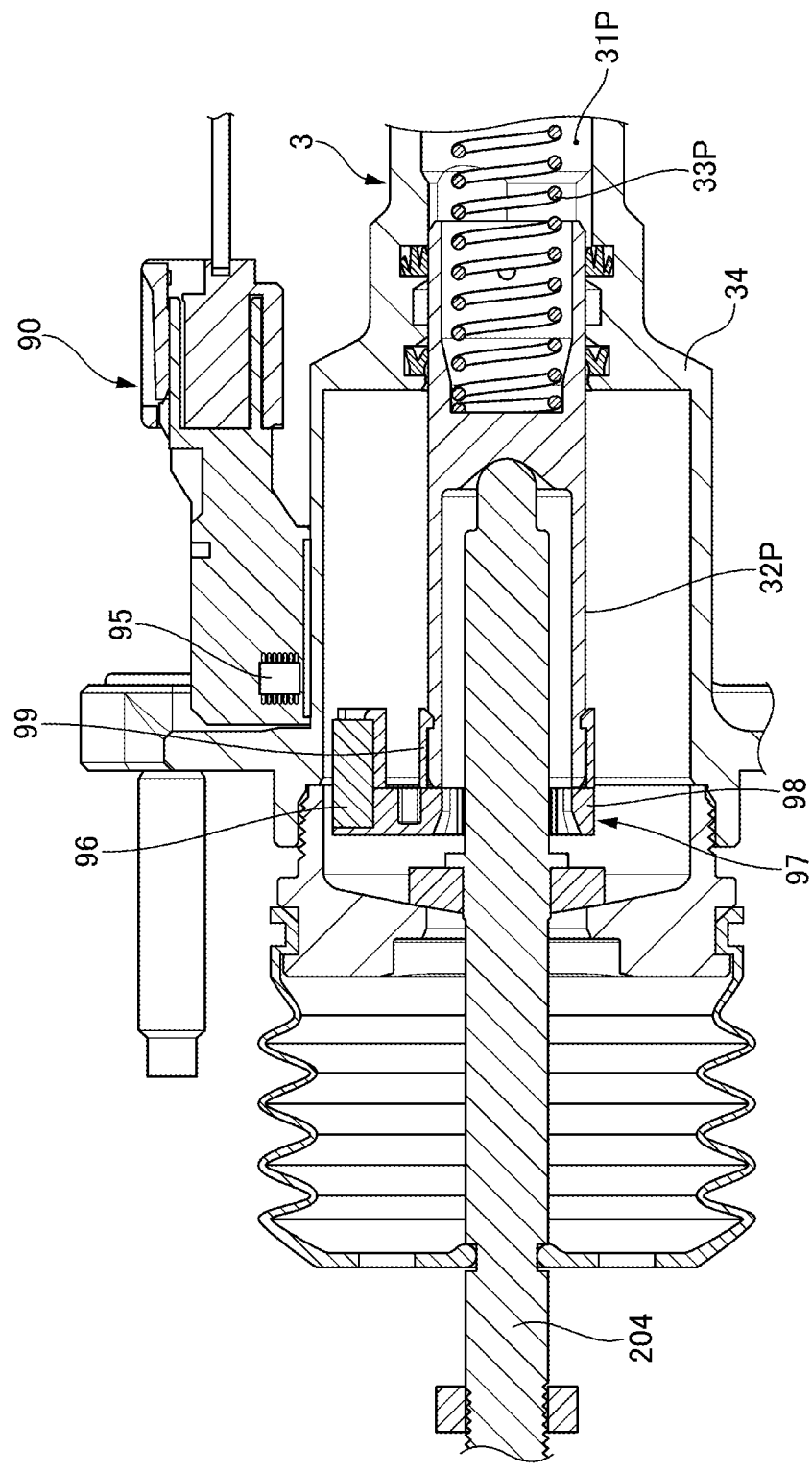
FIG. 2 is a cross-sectional view of main portions of a master cylinder 3 according to the first embodiment.

Next, the configuration of the stroke sensor 90 will be described with reference to FIG. 2. FIG. 2 is a cross-sectional view of main portions of the master cylinder 3 according to the first embodiment.

The stroke sensor 90 includes a detection portion 95 and the magnet 96. The detection portion 95 and the magnet 96 are disposed close to each other. The detection portion 95 is attached to the outer peripheral surface of a master cylinder housing 34. The detection portion 95 includes a Hall IC on which a plurality of Hall elements and an operational amplifier are integrated. The Hall IC detects the position of the magnet 96, i.e., the stroke of the push rod 204 by utilizing the Hall effect (a phenomenon in which, when a magnetic field is applied in a direction perpendicular to an electric current flowing in a substance, an electromotive force is generated in a direction perpendicular to both the electric current and the magnetic field). The Hall IC detects the angle of the magnetic line, and outputs a sensor signal based on the angle of the magnetic line. The magnet 96 is, for example, a neodymium magnet, and is fixed to the primary piston 32P via a magnet holder 97 made from synthetic resin. The detection portion 95 (the Hall element thereof) and the magnet 96 face each other radially. The magnet holder 97 includes an annular portion 98 and a magnet holding portion 99. The annular portion 98 is fixed to the end portion of the primary piston 32P. The annular portion 98 is annularly formed, and the push rod 204 extends through it on the inner peripheral side thereof. The annular portion 98 is restricted from rotating relative to the primary piston 32P by a not-illustrated rotation prohibition member. The magnet holding portion 99 is positioned on the outer peripheral side of the annular portion 98, and holds the magnet 96.

Next, the principle for detecting the angle of the magnetic line by the Hall IC of the stroke sensor 90 will be described.

Figure 3:
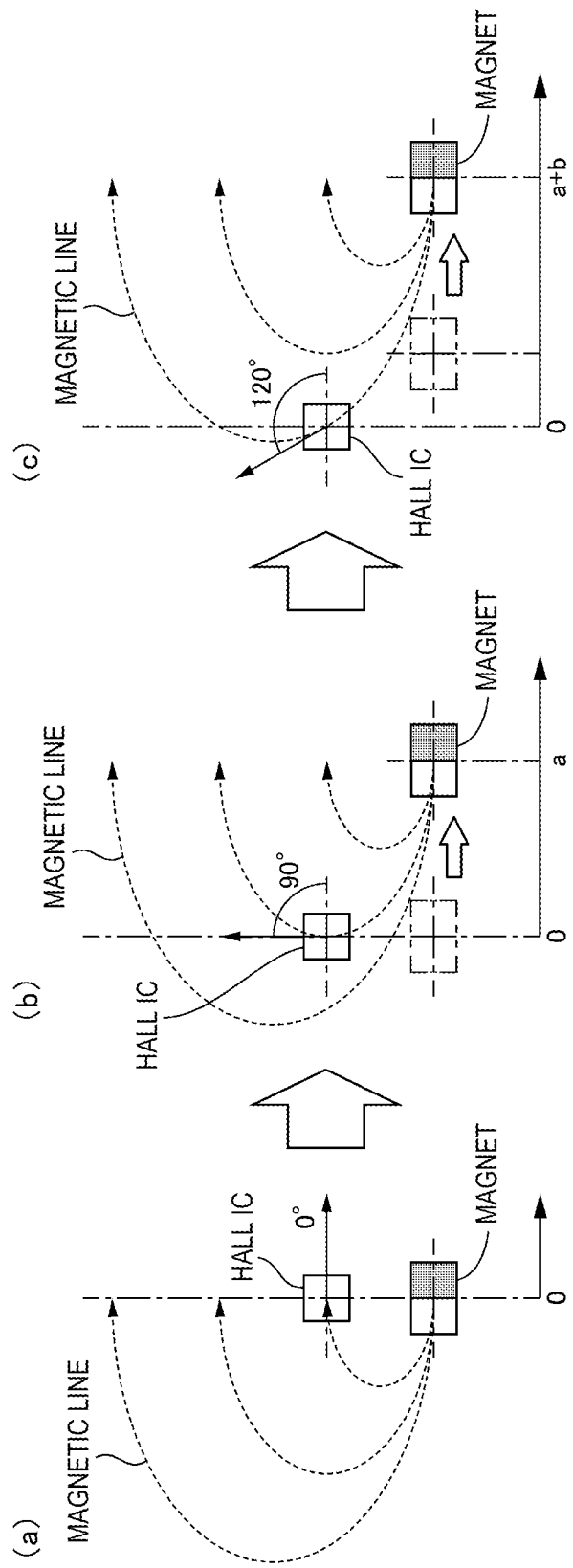
FIG. 3 illustrate the principle for detecting an angle of a magnetic line by a Hall IC.

When the driver presses the brake pedal, the relative position of the magnet to the Hall IC is changed, and therefore the angle (the orientation) of the magnetic line passing through the Hall IC is changed. For example, the angle of the magnetic line passing through the Hall IC is 0° when the magnet is located at an initial position as illustrated in FIG. 3(*a*), but the angle of the magnetic line passing through the Hall IC is changed to 90° when the magnet strokes by a predetermined value a (FIG. 3(*b*)). The angle of the magnetic line passing through the Hall IC is changed to 120° when the magnet further strokes by a predetermined value b (FIG. 3(*c*)). The angle of the magnetic line passing through the Hall IC is changed according to the stroke of the magnet in this manner, and therefore the stroke of the magnet can be detected by identifying the angle of the magnetic line.

Next, two specific examples of the method for detecting the angle of the magnetic line will be described, but any of the following two methods may be employed as the method for detecting the angle of the magnetic line by the stroke sensor 90.

The first specific example is a method that measures the magnitudes of magnetic flux densities by Hall elements arranged in two directions and identifying the angle of the magnetic line based on an arctangent calculation.

Figure 4:
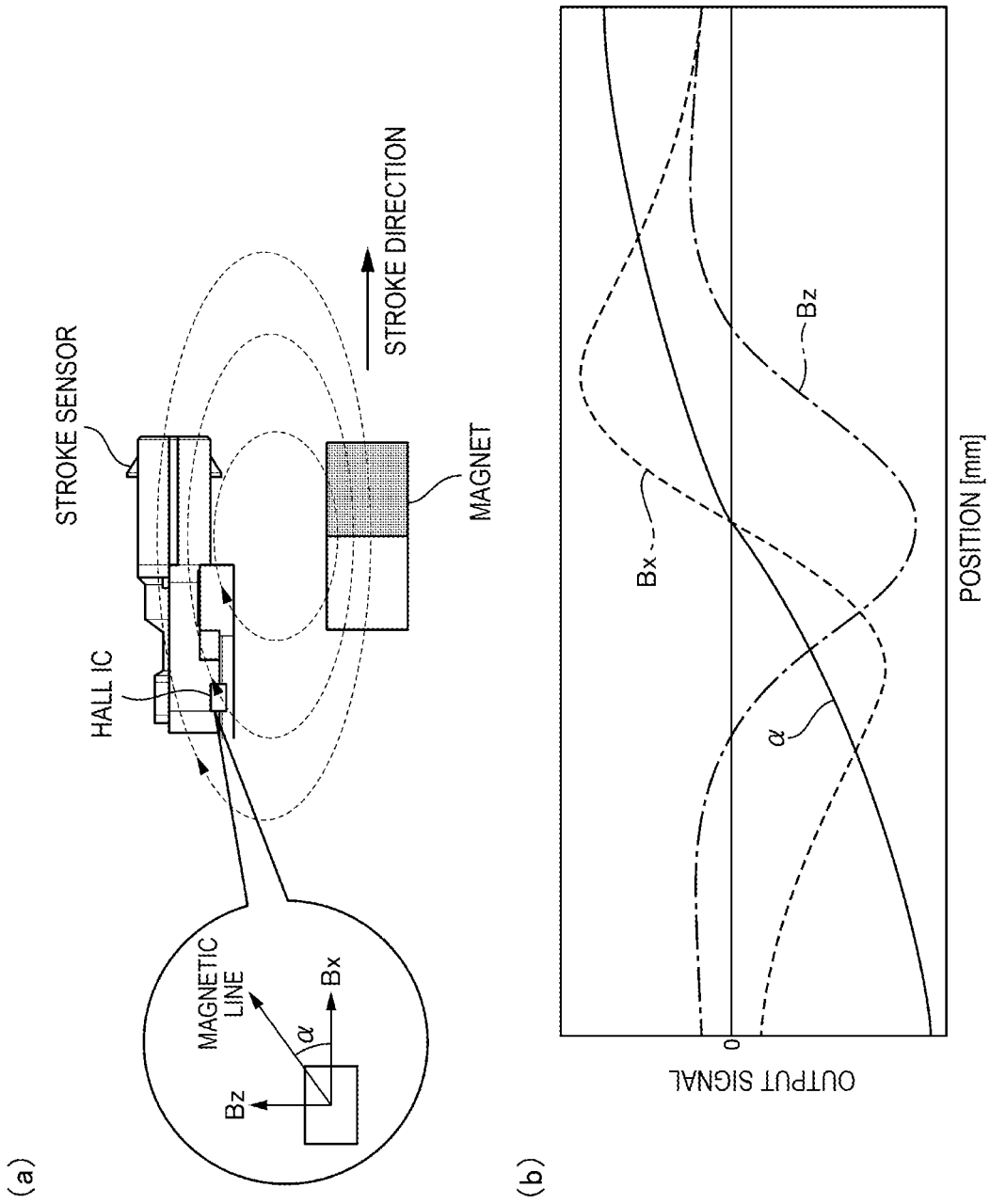
FIG. 4 illustrate a method for measuring the magnitudes of magnetic flux densities by Hall elements arranged in two directions and identifying the angle of the magnetic line based on an arctangent calculation.

As illustrated in FIG. 4(*a*), magnitudes Bx and Bz of the magnetic flux densities in an X direction and a Z direction can be acquired by using a Hall element including electrodes arranged so as to generate a voltage according to the magnitude Bx of the magnetic flux density in the stroke direction of the magnet (the X direction) and a Hall element including electrodes arranged so as to generate a voltage according to the magnitude Bz of the magnetic flux density in the radial direction (the Z direction) and measuring the voltages between the electrodes of the Hall element corresponding to the X direction and between the electrodes of the Hall element corresponding to the Z direction, respectively. Next, an arctangent of Bx/Bz, which is a value resulting from dividing Bx by Bz, is calculated. As a result, an angle α [degrees] of the magnetic line according to the stroke [mm] can be acquired as indicated in FIG. 4(b). The angle α of the magnetic line acquired based on the arctangent calculation has a characteristic represented by such a curve line that the angle α increases as the stroke increases, and therefore is linearly corrected when being used. The processing after the arctangent calculation may be performed by the detection portion 95 or may be performed by the ECU 100. In other words, the angle α of the magnetic line may be calculated by the stroke sensor 90 side or may be calculated by the ECU 100 side.

The second specific example is a method that measures the magnitude of the magnetic flux density by annularly arranged Hall elements and identifying the angle of the magnetic line based on zero cross points.

Figure 5:
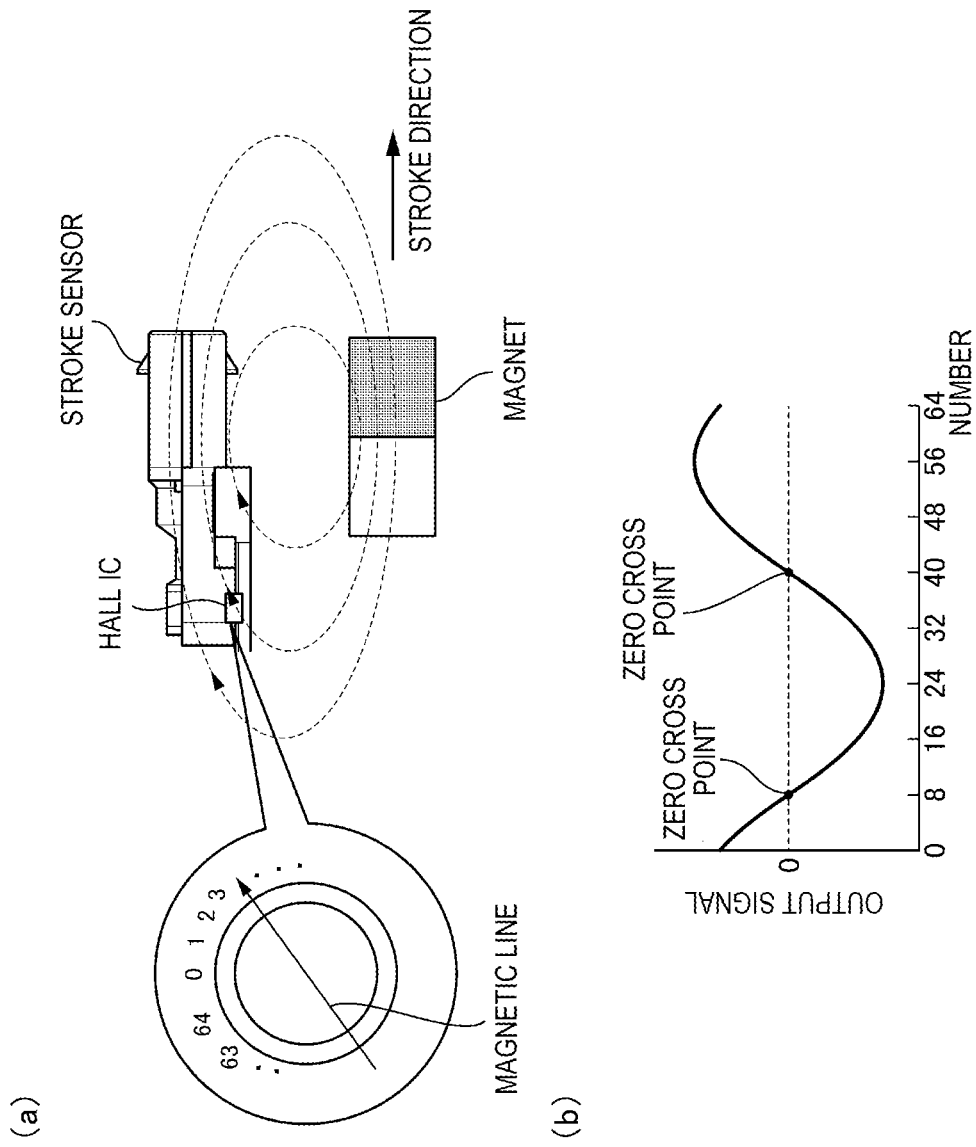
FIG. 5 illustrates a method for measuring the magnitude of the magnetic flux density by annularly arranged Hall elements and identifying the angle of the magnetic line based on zero cross points.

As illustrated in FIG. 5(a), a plurality of Hall elements is annularly arranged, and a voltage value of each of electrodes (electrode numbers 0 to 64) is measured. As a result, the voltage value corresponding to each of the electrode numbers 0 to 64 can be acquired as illustrated in FIG. 5(b). The angle α of the magnetic line according to the stroke is acquired by next identifying a direction perpendicular to a direction connecting two points at which the voltage value is zero (zero cross points) and referring to a sign of a voltage value between the two zero cross points. The processing after the calculation of the zero cross points may be performed by the detection portion 95 or may be performed by the ECU 100. In other words, the angle α of the magnetic line may be calculated by the stroke sensor 90 side or may be calculated by the ECU 100 side.

In the brake control apparatus 1 according to the first embodiment, the fail-safe portion 103 of the ECU 100 performs abnormality determination processing for determining an abnormality in the stroke sensor 90 including an abnormality in the detection of the stroke according to a shift of the relative position between the magnet 96 and the Hall IC from a predetermined position (this is an abnormality regarding the displacement of the rod and hereinafter will be referred to as a "position shift abnormality") by comparing the magnitude of the magnetic flux density acquired from the stroke sensor 90 with a preset standard value with the aim of preventing a reduction in the accuracy of the detection by the stroke sensor 90 according to the shift of the relative position between the magnet 96 and the Hall IC from the predetermined position.

Figure 6:
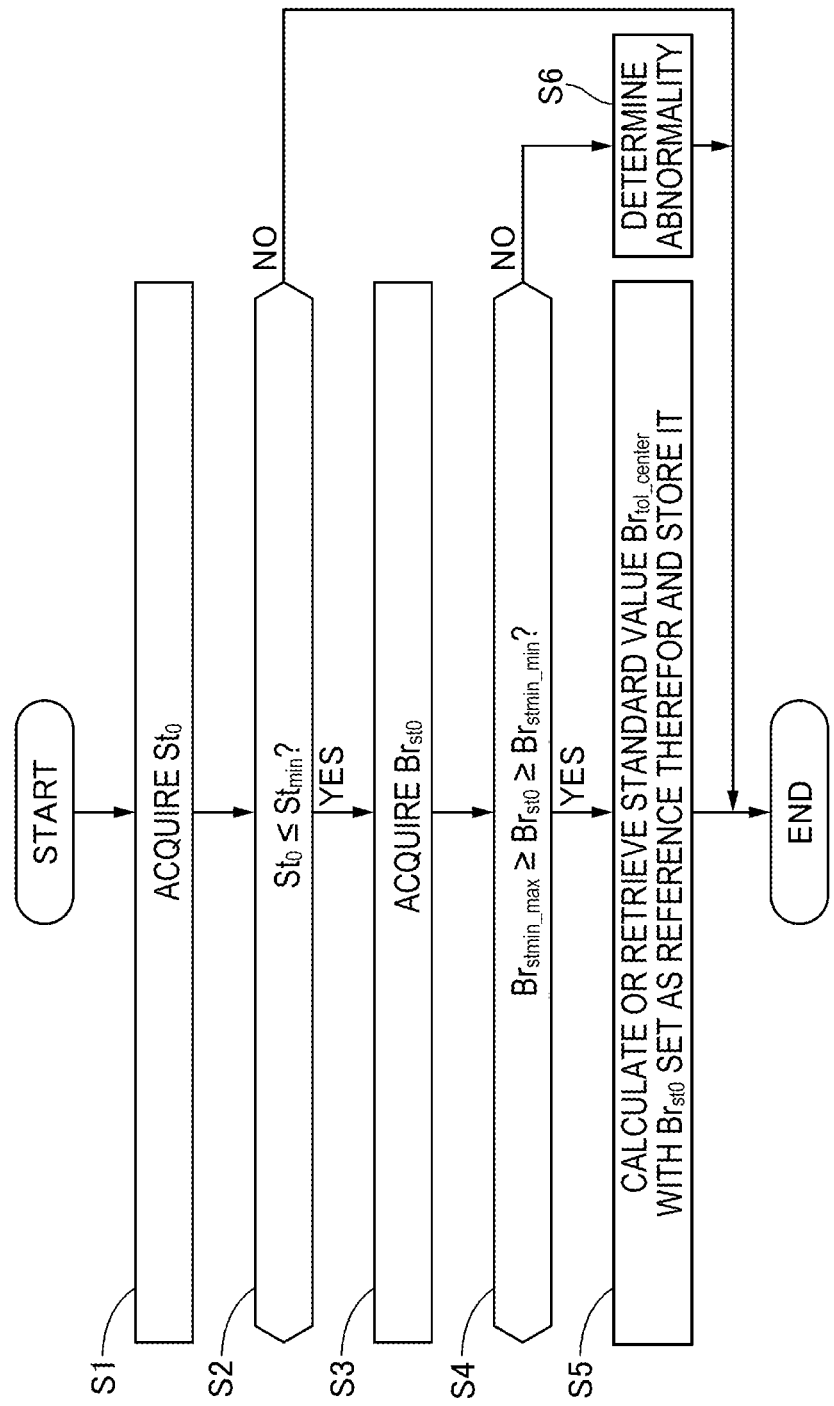
FIG. 6 is a flowchart illustrating a flow of processing for setting a standard central value for performing abnormality determination processing according to the first embodiment.

FIG. 6 is a flowchart illustrating a flow of processing for setting a standard central value for performing the abnormality determination processing according to the first embodiment. This processing is performed with the two outputs from the stroke sensor 90 matching each other.

In step S1, the brake control apparatus 1 acquires a stroke value St0 from the stroke sensor 90.

In step S2, the brake control apparatus 1 determines whether the stroke value St0 is equal to or smaller than a threshold value Stmin to determine whether the stroke value St0 corresponds to a position where the stroke of the push rod 204 is 0 [mm] (the stroke initial value). If the determination in step S2 is YES, the processing proceeds to step S3. If the determination in step S2 is NO, the present processing is ended. Now, the threshold value Stmin is a value acquired by adding a dimensional tolerance and an assembling error between the master cylinder 3 and the stroke sensor 90, a dimensional error of the stroke sensor 90, a detection error of the stroke sensor 90, and an angular error in the magnetic flux density of the magnet 96 to the stroke 0 [mm] of the push rod 204.

In step S3, the brake control apparatus 1 acquires a magnitude Brst0 of the magnetic flux density at the time of the stroke value St0 from the stroke sensor 90.

In step S4, the brake control apparatus 1 determines whether the magnitude Brst0 of the magnetic flux density is equal to or larger than a lower limit threshold value Brst0_min and equal to or smaller than an upper limit threshold value Brst0_max (>Brst0_min) to confirm the soundness of the magnitude Brst0 of the magnetic flux density of the stroke sensor 90. If the determination in step S4 is YES, the processing proceeds to step S5. If the determination in step S4 is NO, the processing proceeds to step S6. Now, the lower limit threshold value Brst0_min and the upper limit threshold value Brst0_max are threshold values for the magnitude of the magnetic flux density of the stroke sensor 90 when the stroke of the push rod 204 is located at the position of 0 [mm]. These threshold values are set based on an error in the magnitude of the magnetic flux density of the magnet 96 due to the temperature and a reduction in the durability in addition to the errors described in step S2.

Figure 7:
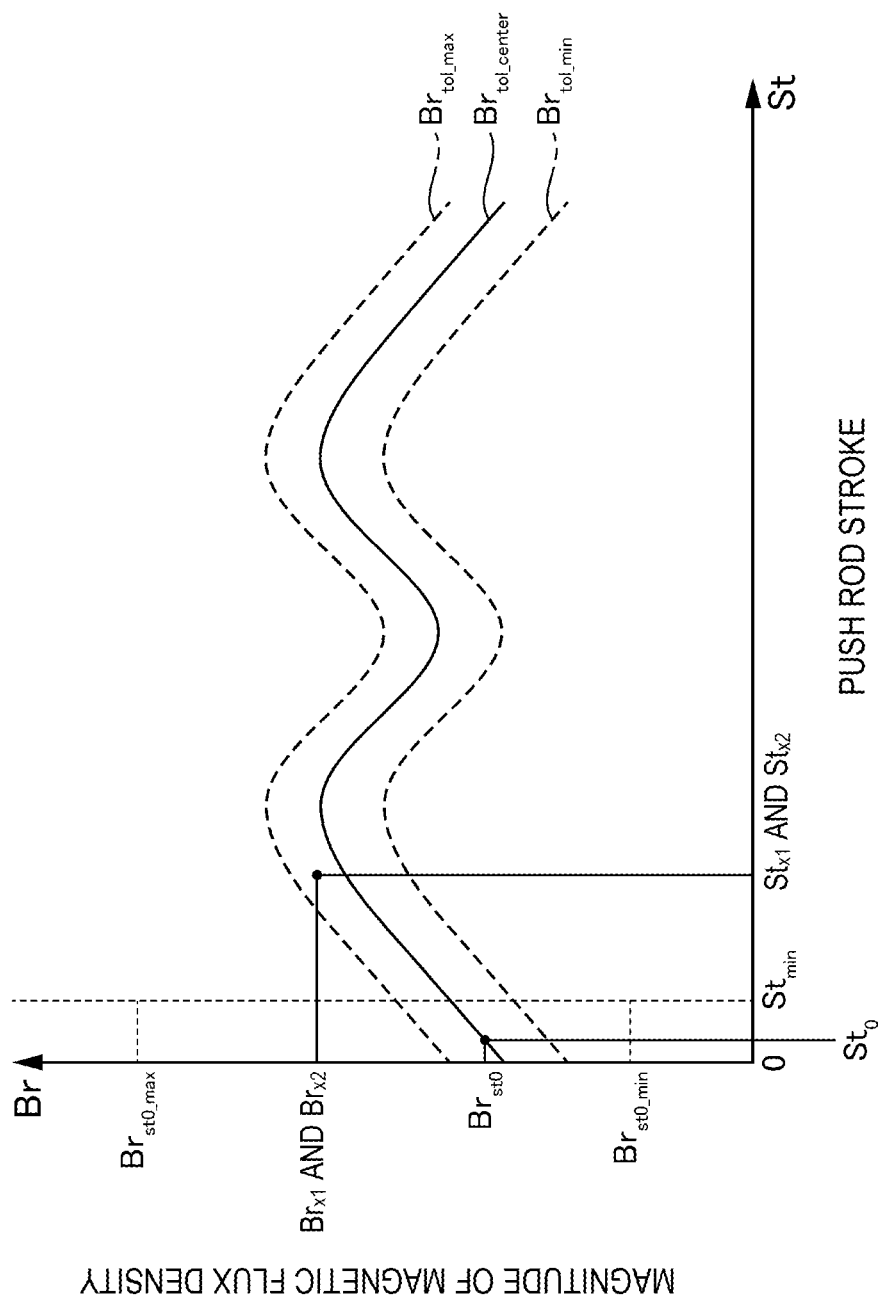
FIG. 7 illustrates the characteristic of the standard central value according to the stroke of a push rod 204.

In step S5, the brake control apparatus 1 sets a standard central value Brtol_center according to the stroke based on the characteristic of the magnitude of the magnetic flux density with respect to the stroke with Brst0 set as a reference therefor, and stores it into the memory. The characteristic of the magnitude of the magnetic flux density with respect to the stroke is a characteristic identified from an experiment or the like in advance based on the relationship between the stroke and the magnitude of the magnetic flux density when the relative position between the magnet 96 and the Hall IC is located at the predetermined position, and is stored in the memory. FIG. 7 illustrates the characteristic of the standard central value Brtol_center according to the stroke of the push rod 204. The characteristic of the standard central value Brtol_center according to the stroke is a waveform curve having three inflexion points, and is shaped in such a manner that a region convexed toward the small side where the magnetic flux density is small is sandwiched between two regions convexed toward the large side where the magnitude of the magnetic flux density is large.

By this processing, the brake control apparatus 1 can set the standard central value Brtol_center with respect to the stroke of the push rod 204 according to the individual brake control apparatus 1.

Figure 8:
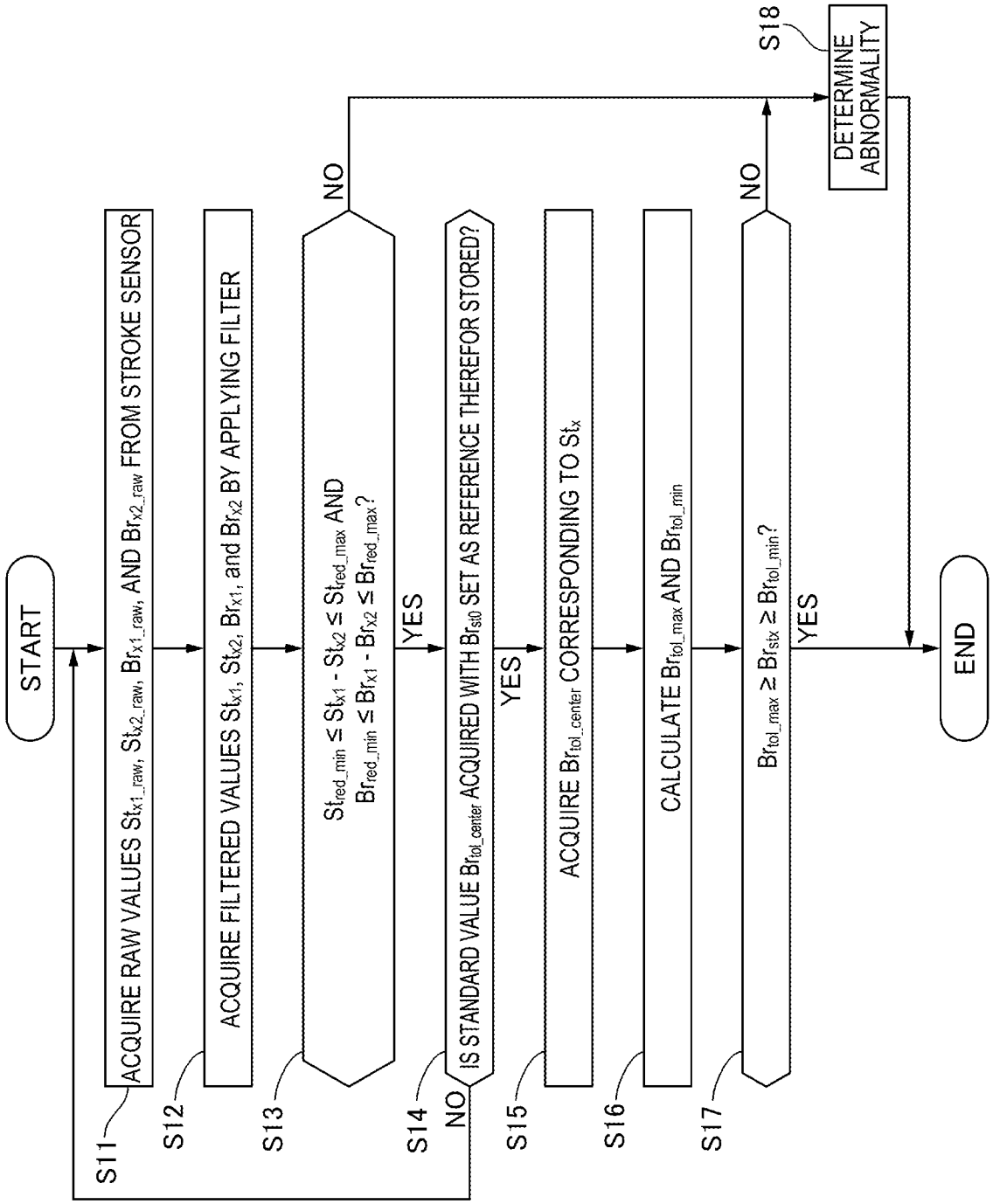
FIG. 8 is a flowchart illustrating a flow of the processing for determining an abnormality in a stroke sensor 90 according to the first embodiment.

FIG. 8 is a flowchart illustrating a flow of the processing for determining an abnormality in the stroke sensor 90 according to the first embodiment.

In step S11, the brake control apparatus 1 acquires stroke raw values Stx1_raw and Stx2_raw and raw values Brx1_raw and Brx2_raw of the magnitudes of the magnetic flux densities from the stroke sensor 90.

In step S12, the brake control apparatus 1 performs filter processing on the acquired stroke raw values Stx1_raw and Stx2_raw and raw values Brx1_raw and Brx2_raw of the magnitudes of the magnetic flux densities, thereby acquiring stroke filtered values Stx1 and Stx2 and filtered values Brx1 and Brx2 of the magnitudes of the magnetic flux densities.

In step S13, the brake control apparatus 1 determines whether the difference (Stx1−Stx2) between the two stroke filtered values Stx1 and Stx2 is equal to or larger than a lower limit threshold value Stred_min and equal to or smaller than an upper limit threshold value Stred_max (>Stred_min), and the difference (Brx1−Brx2) between the two filtered values Brx1 and Brx2 of the magnitudes of the magnetic flux densities is equal to or larger than a lower limit threshold value Brred_min and equal to or smaller than an upper limit threshold value Brred_max (>Brred_min). If the determination in step S13 is YES, the processing proceeds to step S14. If the determination in step S13 is NO, the processing proceeds to step S18. Each of the threshold values Stred_min, Stred_max, Brred_min, and Brred_max is set based on the error in the measurement of the stroke by the stroke sensor 90. Step S13 is a step of determining whether no abnormality has occurred in the stroke sensor 90 except for the position shift abnormality.

In step S14, the brake control apparatus 1 determines whether the standard central value Brtol_center according to the stroke set in step S5 in FIG. 3 is stored in the memory. If the determination in step S14 is YES, the processing proceeds to step S15. If the determination in step S14 is NO, the processing returns to step S11.

In step S15, the brake control apparatus 1 acquires the standard central value Brtol_center for the stroke filtered value Stx (Stx1 or Stx2) based on the standard central value Brtol_center according to the stroke.

In step S16, the brake control apparatus 1 calculates a standard upper limit value Brtol_max and a standard lower limit value Brtol_min based on the standard central value Brtol_center. As the calculation method, the brake control apparatus 1 calculates them by adding the detection error of the stroke sensor 90 and the error in the magnitude of the magnetic flux density due to the temperature and a reduction in the durability of the magnet 96 to the standard value Brtol_center. As illustrated in FIG. 7, the standard upper limit value Brtol_max and the standard lower limit value Brtol_min are shaped like waveforms upward and downward offset from the standard central value Brtol_center.

In step S17, the brake control apparatus 1 determines whether the filtered value Brstx (Brx1 or Brx2) of the magnitude of the magnetic flux density is equal to or larger than the standard lower limit value Brtol_min and equal to or smaller than the standard upper limit value Brtol_max. If the determination in step S17 is YES, the present processing is ended. If the determination in step S17 is NO, the processing proceeds to S18.

In step S18, the brake control apparatus 1 determines that an abnormality has occurred in the stroke sensor 90, and ends the present control.

Next, advantageous effects of the first embodiment will be described.

Figure 9:
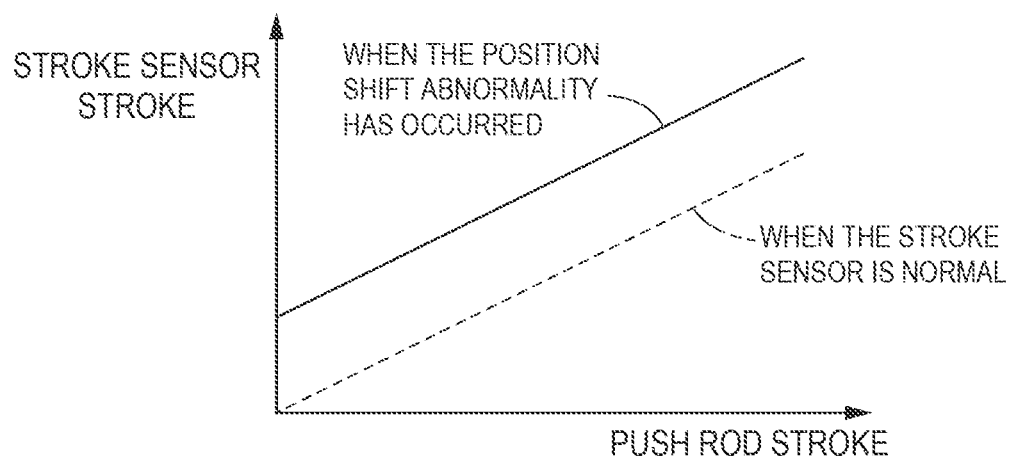
FIG. 9 illustrates the relationship between the stroke of the push rod 204 and the stroke calculated based on the angle of the magnetic line acquired from the stroke sensor 90.

In a stroke sensor that detects the stroke of the brake pedal, the relative position between the magnet and the Hall IC may be shifted from the predetermined position at the time of assembling or while the vehicle is running. If the orientation of the magnet relative to the Hall IC is changed due to this shift of the relative position, the angle of the magnetic line received by the Hall IC at some stroke position is changed from the angle of the magnetic line received by the Hall IC when the relative position is located at the predetermined position. The above-described shift of the relative position leads to a reduction in the accuracy of the detection of the stroke and makes it impossible to continue the hydraulic pressure control by the by-wire control, and therefore necessitates a fail-safe such as switching the brake control from the by-wire control to the pressing force brake. However, the abnormality in the detection of the stroke according to the above-described shift of the relative position (the position shift abnormality) cannot be detected only from the angle of the magnetic line acquired from the stroke sensor. FIG. 9 illustrates the relationship between the stroke of the push rod 204 (a push rod stroke) and the stroke calculated based on the angle of the magnetic line acquired from the stroke sensor 90 (a stroke sensor stroke). When the position shift abnormality has occurred, the stroke sensor stroke deviates from the push rod stroke, but whether the stroke sensor stroke is a correct value cannot be determined only based on the value of the stroke sensor stroke.

Figure 10:
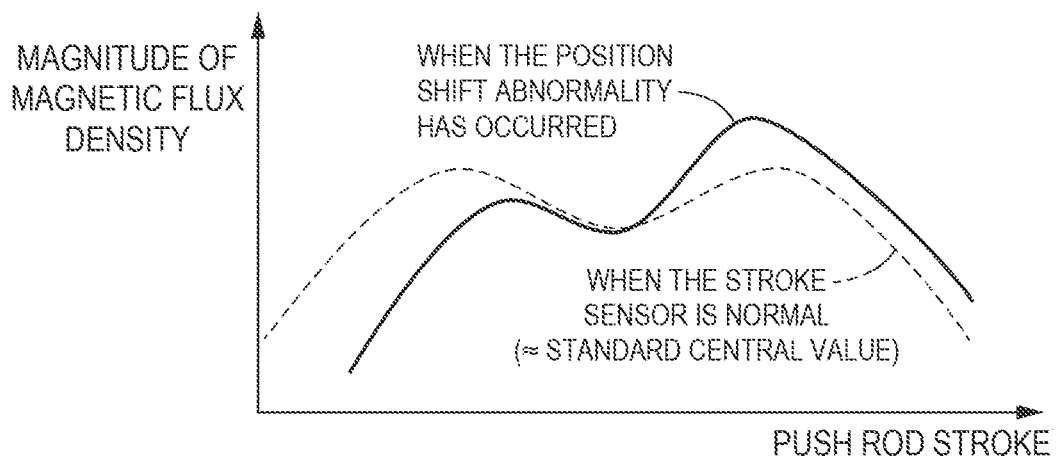
FIG. 10 illustrates the relationship between the stroke of the push rod 204 and the magnitude of the magnetic flux density.
Figure 11:
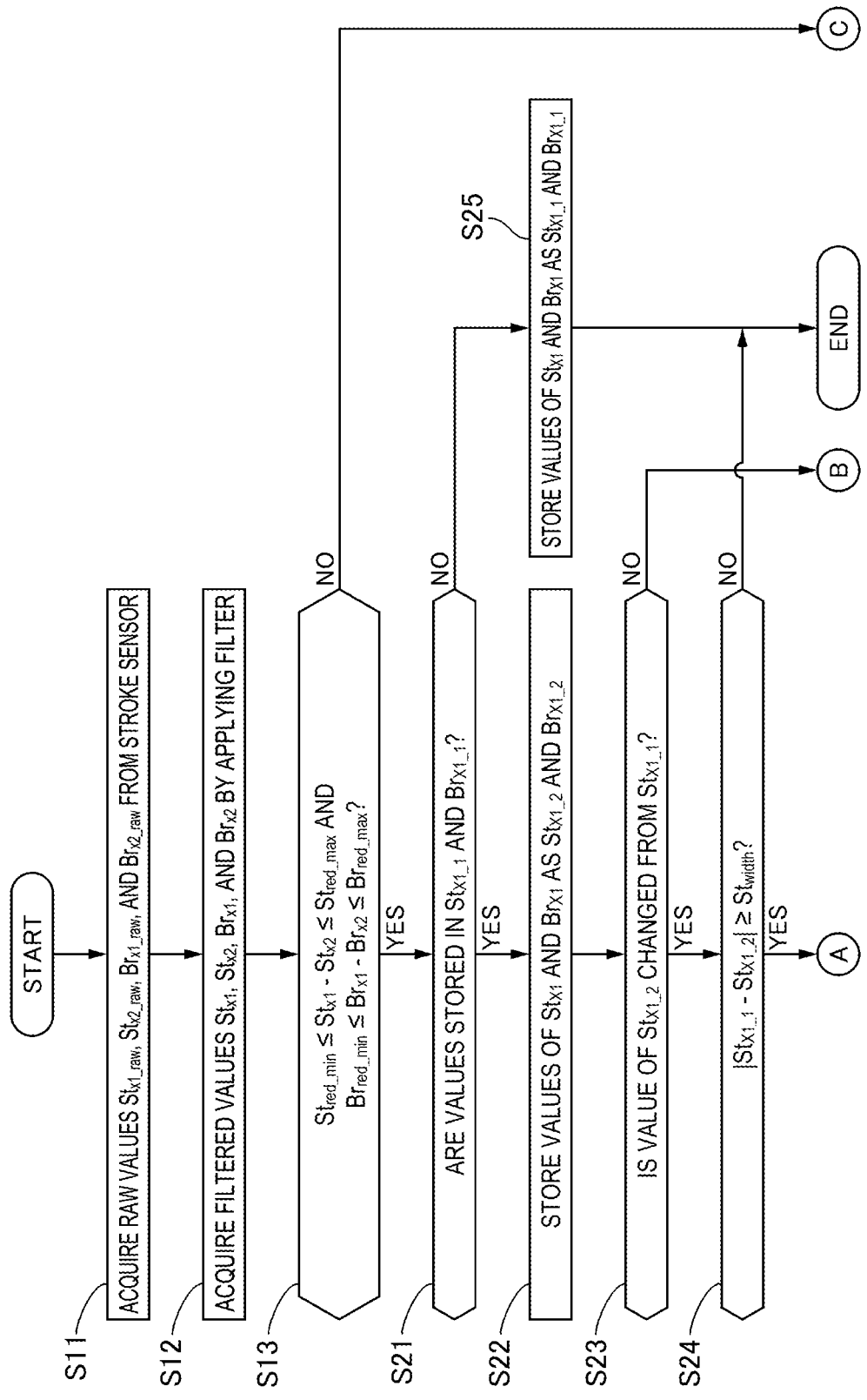
FIG. 11 is a flowchart illustrating a flow of processing for determining the abnormality in the stroke sensor 90 according to a second embodiment.
Figure 12:
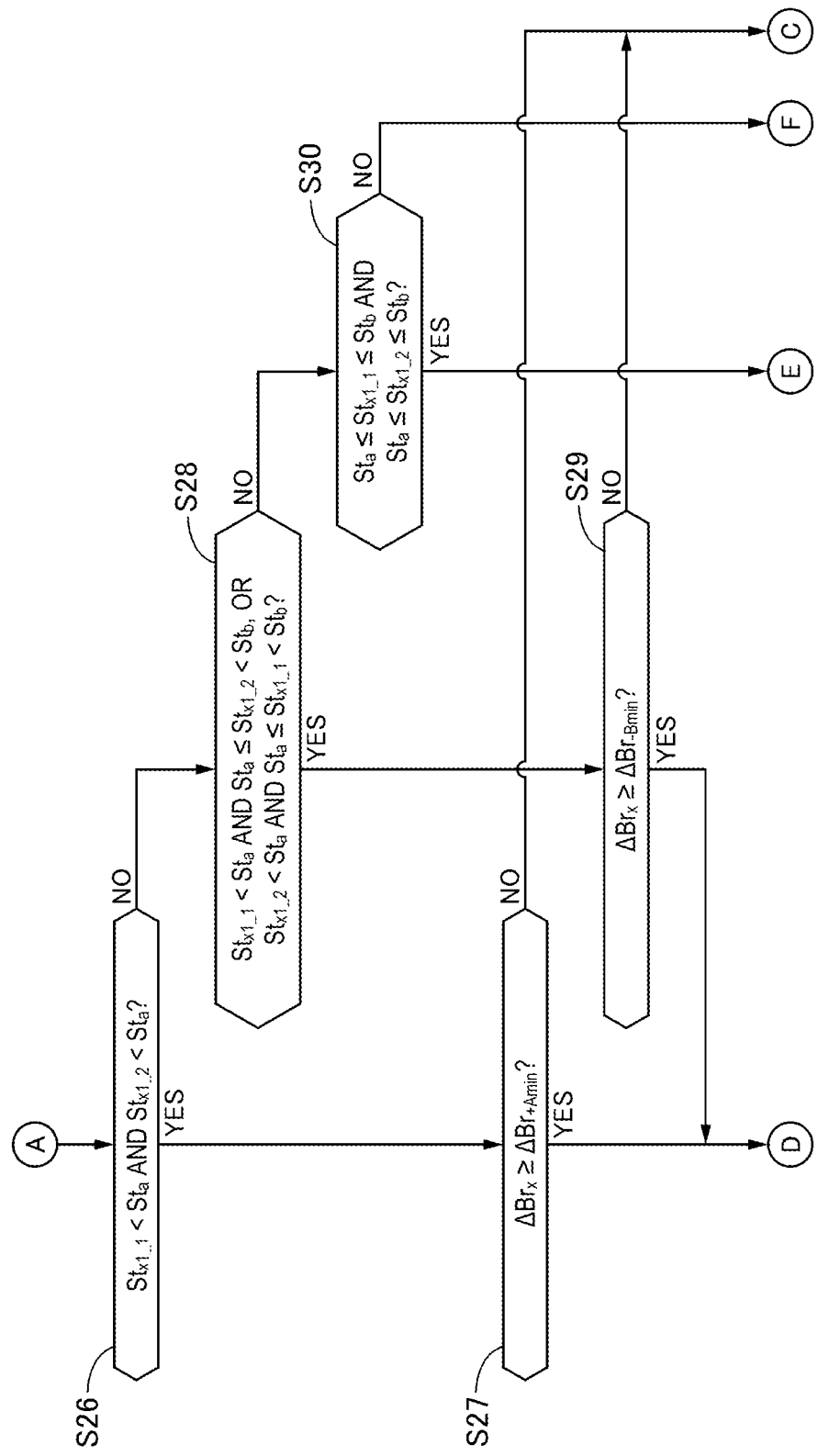
FIG. 12 is a flowchart illustrating the flow of the processing for determining the abnormality in the stroke sensor 90 according to the second embodiment.
Figure 13:
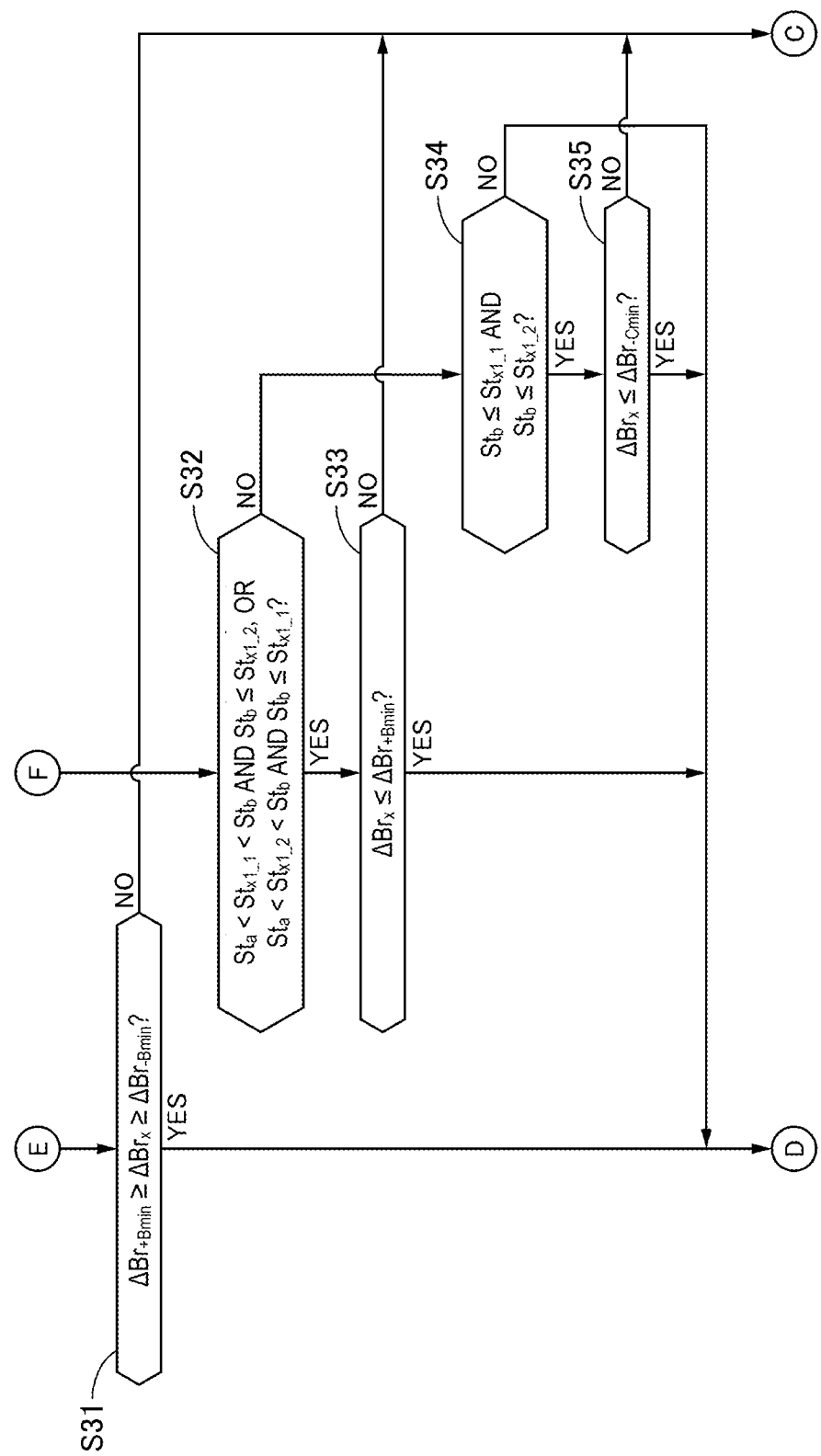
FIG. 13 is a flowchart illustrating the flow of the processing for determining the abnormality in the stroke sensor 90 according to the second embodiment.
Figure 14:
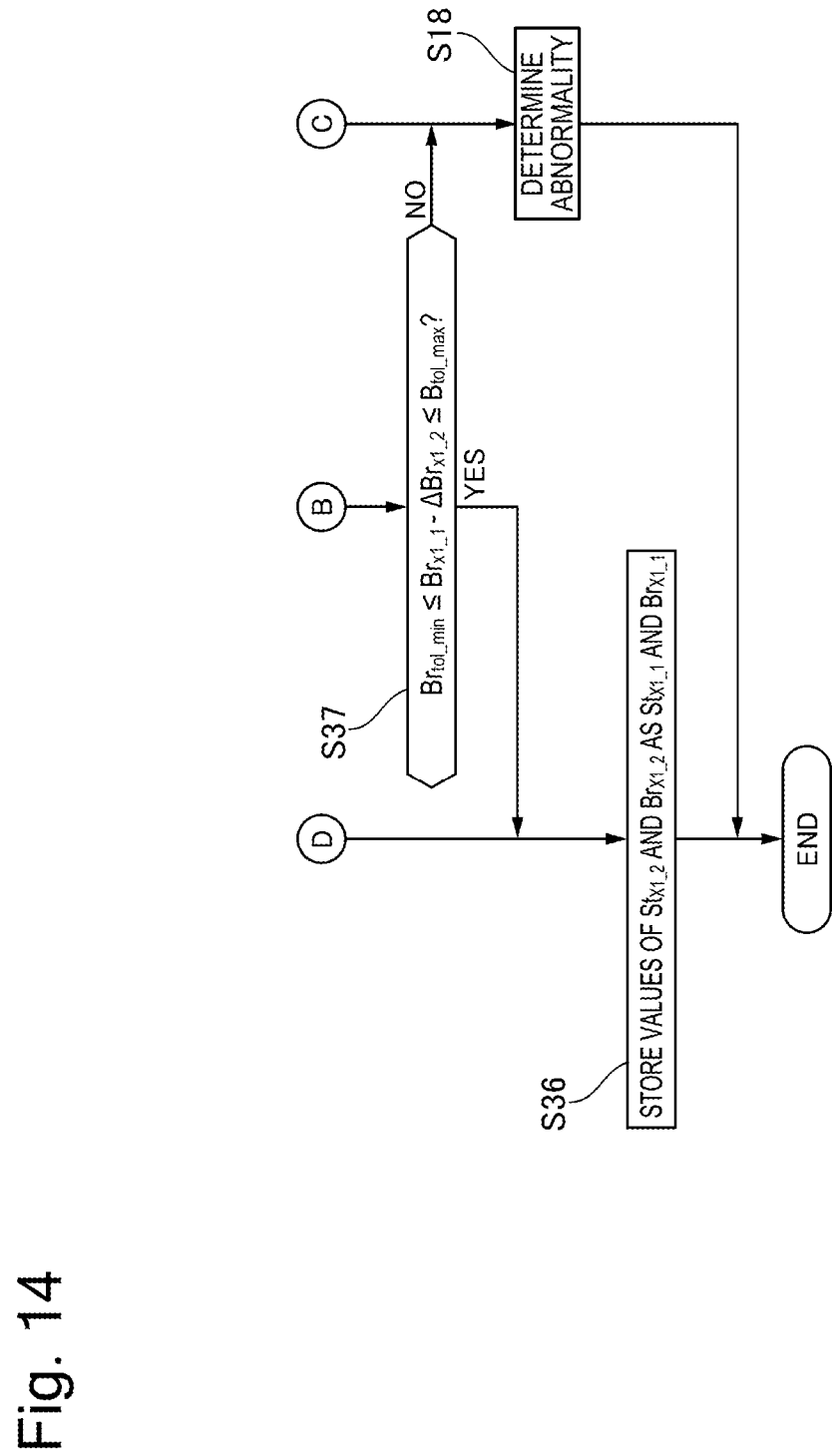
FIG. 14 is a flowchart illustrating the flow of the processing for determining the abnormality in the stroke sensor 90 according to the second embodiment.

On the other hand, in the vehicle pedal stroke detection apparatus according to the first embodiment, the ECU 100 acquires the raw values Brx1_raw and Brx2_raw of the magnitudes of the magnetic flux densities in addition to the stroke raw values Stx1_raw and Stx2_raw from the stroke sensor 90. The ECU 100 performs the filter processing on the acquired raw values Brx1_raw and Brx2_raw of the magnitudes of the magnetic flux densities, and compares the filtered value Brstx of the magnitude of the magnetic flux density and the preset standard central value Brtol_center. FIG. 10 illustrates the relationship between the stroke of the push rod 204 and the magnitude of the magnetic flux density. When the position shift abnormality has occurred, the magnitude of the magnetic flux density with respect to the push rod stroke exhibits a characteristic deviating from the characteristic when the stroke sensor 90 is normal, i.e., the characteristic of the standard central value Brtol_center with respect to the push rod stroke. Therefore, the position shift abnormality can be detected by referring to the deviation of the filtered value Brstx from the standard central value Brtol_center. As a result, the brake control apparatus 1 can prevent the reduction in the accuracy of the detection by the stroke sensor 90, thereby improving the accuracy of the detection of the pedal stroke S. Further, the brake control apparatus 1 can improve the reliability of the vehicle pedal stroke detection apparatus by determining the position shift abnormality based on the comparison between the filtered value Brstx of the magnitude of the magnetic flux density and the standard central value Brtol_center. Further, in the first embodiment, the brake control apparatus 1 can detect the position shift abnormality regardless of whether the brake operation is performed by comparing the magnetic flux density in terms of the magnitude thereof. In other words, the position shift abnormality can be detected even without the driver pressing the brake pedal 2 (without the push rod 204 stroking).

The ECU 100 determines whether the filtered value Brstx of the magnitude of the magnetic flux density is equal to or larger than the standard lower limit value Brtol_min and equal to or smaller than the standard upper limit value Brtol_max. The stroke sensor 90 has the predetermined detection error, and the magnet 96 has the error in the magnitude of the magnetic flux density due to a change in the temperature and a reduction in the durability. The position shift abnormality can be further highly accurately detected by setting the standard value in consideration of these errors.

The ECU 100 calculates the standard central value Brtol_center according to the stroke based on the magnitude Brst0 of the magnetic flux density corresponding to the stroke initial value. As a result, the standard central value Brtol_center can be set without the driver pressing the brake pedal 2 before the vehicle starts running, and therefore the position shift abnormality can be detected before the brake operation is performed.

The ECU 100 determines an abnormality in the magnitude Brst0 of the magnetic flux density corresponding to the stroke initial value based on whether the magnitude Brst0 of the magnetic flux density corresponding to the stroke initial value is equal to or larger than the lower limit threshold value Brst0_min and equal to or smaller than the upper limit threshold value Brst0_max. The stroke sensor 90 has the predetermined detection error, and the magnet 96 has the error in the magnitude of the magnetic flux density due to a change in the temperature and a reduction in the durability. The standard central value Brtol_center can be further appropriately set by determining an abnormality in Brst0 in consideration of these errors.

The ECU 100 detects the position shift abnormality regardless of whether the brake operation is performed. In other words, the position shift abnormality can also be detected even when the brake pedal 2 is in a non-operated state. Therefore, the safety can be improved by switching the brake control from the by-wire control to the pressing force brake before the brake operation is performed when the position shift abnormality is detected.

The stroke sensor 90 is a two-output type stroke sensor, and the ECU 100 determines an abnormality in the stroke sensor 90 based on the difference (Stx1−Stx2) between the two stroke filtered values Stx1 and Stx2 and the difference (Brx1−Brx2) between the two filtered values Brx1 and Brx2 of the magnitudes of the magnetic flux densities. When no abnormality has occurred in the stroke sensor 90 except for the position shift abnormality, the two stroke filtered values Stx1 and Stx2 and the two filtered values Brx1 and Brx2 of the magnitudes of the magnetic flux densities have equal values, respectively. Therefore, when different values are output as at least one pair of the two stroke filtered values Stx1 and Stx2 and the two filtered values Brx1 and Brx2 of the magnitudes of the magnetic flux densities, it can be determined that an abnormality has occurred in the stroke sensor 90.

The vehicle pedal stroke detection apparatus according to the first embodiment detects the stroke of the brake pedal 2 in the brake control apparatus 1. The brake control apparatus 1 is a brake-by-wire apparatus that generates the target wheel cylinder hydraulic pressure in each of the wheel cylinders 8 based on the stroke of the brake pedal 2 detected by the stroke sensor 90 and actuates the pump 7 so as to be able to acquire the target wheel cylinder hydraulic pressure. Therefore, the brake control apparatus 1 can improve the control accuracy of the by-wire control and realize application of a braking force further conforming with the driver's braking intention by detecting the position shift abnormality in the stroke sensor 90.

Second Embodiment

A second embodiment has a basic configuration similar to the first embodiment, and therefore will be described focusing only on differences from the first embodiment.

FIGS. 11 to 14 are flowcharts illustrating a flow of processing for determining an abnormality in the stroke sensor 90 according to the second embodiment. This flow will be described, identifying steps in which similar processing to the flowchart illustrated in FIG. 8 is performed by the same step numbers, and omitting descriptions thereof.

In step S21, the brake control apparatus 1 determines whether a stroke value Stx1_1 and a value Brx1_1 of the magnitude of the magnetic flux density of the first point are stored. If the determination in step S21 is YES, the processing proceeds to step S21. If the determination in step S21 is NO, the processing proceeds to step S25.

In step S22, the brake control apparatus 1 stores the stroke value Stx1 and the magnitude Brx1 of the magnetic flux density of the first point into the memory as a stroke value Stx1_2 and a magnitude Brx1_2 of the magnetic flux density of the second point. The stored output of the stroke sensor 90 may be a stroke value Stx2 and a magnitude Brx2 of the magnetic flux density of another one of the redundant outputs, but is desirable to be the same as the output stored when the first point is stored.

In step S23, the brake control apparatus 1 determines whether the stroke value Stx1_2 of the second point is changed from the stoke value Stx1_1 of the first point. If the determination in step S23 is YES, the processing proceeds to step S24. If the determination in step S23 is NO, the processing proceeds to step S37. If Stx1_2 is changed from Stx1_1, the brake control apparatus 1 can evaluate a value calculated by differentiating the magnitude of the magnetic flux density with respect to the stroke $\Delta Brx\{(Brx1\_2-Brx1\_1)/(Stx1\_2-Stx1\_1)\}$.

In step S24, the brake control apparatus 1 determines whether an interval Stx1_1−Stx1_2 between the stroke values of the two points is equal to or larger than a threshold value Stwidth. If the determination in step S24 is YES, the processing proceeds to step S26. If the determination in step S24 is NO, the present processing is ended. The threshold value Stwidth is set so as to become an interval between stroke values from which $\Delta Brx$ can be calculated.

In step S25, the brake control apparatus 1 stores the stroke value Stx1 and the magnitude Brx1 of the magnetic flux density into the memory as Stx1_1 and Brx1_1, respectively. The stored output of the stroke sensor 90 may be the stroke value Stx2 and the magnitude Brx2 of the magnetic flux density of another one of the two outputs.

In step S26, the brake control apparatus 1 determines whether both the stroke values Stx1_1 and Stx1_2 stored in the memory are smaller than a threshold value Sta. If the determination in step S26 is YES, the processing proceeds to step S27. If the determination in step S26 is NO, the processing proceeds to step S28. This step is a step of determining whether both the stroke values Stx1_1 and Stx1_2 are located in a stroke section A in the stroke range of the push rod 204. The threshold value Sta is set by being calculated based on a stroke position in a section where the waveform of the magnitude of the magnetic flux density is convexed upward in consideration of the dimensional tolerance and the assembling error between the master cylinder 3 and the stroke sensor 90, the dimensional error of the stroke sensor 90, the detection error of the stroke sensor 90, and the error in the magnitude of the magnetic flux density of the magnet 96.

In step S27, the brake control apparatus 1 determines whether the value $\Delta Brx$ calculated by differentiating the magnitude of the magnetic flux density with respect to the stroke is equal to or larger than a standard value $\Delta Br+Amin$. If the determination in step S27 is YES, the processing proceeds to step S36. If the determination in step S27 is NO, the processing proceeds to step S18. This step is a step of determining whether $\Delta Brx$ falls within a range expected in the stroke section A.

In step S28, the brake control apparatus 1 determines whether one of the stroke values Stx1_1 and Stx1_2 stored in the memory is smaller than the threshold value Sta, and the other of them is equal to or larger than the threshold value Sta and smaller than a threshold value Stb (>Sta). If the determination in step S28 is YES, the processing proceeds to step S29. If the determination in step S28 is NO, the processing proceeds to step S30. This step is a step of determining whether one and the other of the stroke values Stx1_1 and Stx1_2 are located in the stroke section A and a stroke section B, respectively. The threshold value Stb is set by being calculated based on a stroke position in a section where the waveform of the magnitude of the magnetic flux density is convexed upward in consideration of the dimensional tolerance and the assembling error between the master cylinder 3 and the stroke sensor 90, the dimensional error of the stroke sensor 90, the detection error of the stroke sensor 90, and the error in the magnitude of the magnetic flux density of the magnet 96.

In step S29, the brake control apparatus 1 determines whether the value ΔBrx calculated by differentiating the magnitude of the magnetic flux density with respect to the stroke is equal to or larger than a standard value ΔBr−Bmin. If the determination in step S29 is YES, the processing proceeds to step S36. If the determination in step S29 is NO, the processing proceeds to step S18. This step is a step of determining whether ΔBrx falls within a range expected in a section extending across the stroke section A and the stroke section B.

In step S30, the brake control apparatus 1 determines whether both the stroke values Stx1_1 and Stx1_2 stored in the memory are equal to or larger than the threshold value Sta and equal to or smaller than the threshold value Stb. If the determination in step S30 is YES, the processing proceeds to step S31. If the determination in step S30 is NO, the processing proceeds to step S32. This step is a step of determining whether both the stroke values Stx1_1 and Stx1_2 are located in the stroke section B in the stroke range of the push rod 204.

In step S31, the brake control apparatus 1 determines whether the value ΔBrx calculated by differentiating the magnitude of the magnetic flux density with respect to the stroke is equal to or larger than the standard value ΔBr−Bmin and equal to or smaller than a standard value ΔBr+Bmin. If the determination in step S31 is YES, the processing proceeds to step S36. If the determination in step S31 is NO, the processing proceeds to step S18. This step is a step of determining whether ΔBrx falls within a range expected in the stroke section B.

In step S32, the brake control apparatus 1 determines whether one of the stroke values Stx1_1 and Stx1_2 stored in the memory is equal to or larger than the threshold value Sta and smaller than the threshold value Stb, and the other of them is equal to or larger than the threshold value Stb. This step is a step of determining whether one and the other of the stroke values Stx1_1 and Stx1_2 are located in the stroke section B and a stroke section C, respectively.

In step S33, the brake control apparatus 1 determines whether the value ΔBrx calculated by differentiating the magnitude of the magnetic flux density with respect to the stroke is equal to or smaller than the standard value ΔBr+Bmin. If the determination in step S33 is YES, the processing proceeds to step S36. If the determination in step S33 is NO, the processing proceeds to step S18. This step is a step of determining whether ΔBrx falls within a range expected in a section extending across the stroke section B and the stroke section C.

In step S34, the brake control apparatus 1 determines whether both the stroke values Stx1_1 and Stx1_2 stored in the memory are equal to or larger than the threshold value Stb. If the determination in step S34 is YES, the processing proceeds to step S35. If the determination in step S34 is NO, the processing proceeds to step S36. This step is a step of determining whether both the stroke values Stx1_1 and Stx1_2 are located in the stroke section C in the stroke range of the push rod 204.

In step S35, the brake control apparatus 1 determines whether the value ΔBrx calculated by differentiating the magnitude of the magnetic flux density with respect to the stroke is equal to or smaller than a standard value ΔBr−Cmin. If the determination in step S35 is YES, the processing proceeds to step S36. If the determination in step S35 is NO, the processing proceeds to step S18. This step is a step of determining whether ΔBrx falls within a range expected in the stroke section C.

In step S36, the brake control apparatus 1 stores the stroke value Stx1_2 and the magnitude Brx1_2 of the magnetic flux density of the second point into the memory as the stroke value Stx_1 and the magnitude Btx_1 of the magnetic flux density of the first point.

In step S37, the brake control apparatus 1 determines whether the difference Brx1−Brx2 between the magnitudes of the magnetic flux densities is equal to or larger than the standard lower limit value Brtol_min and equal to or smaller than the standard upper limit value Brtol_max. If the determination in step S37 is YES, the processing proceeds to step S36. If the determination in step S37 is NO, the processing proceeds to step S18.

Next, advantageous effects of the second embodiment will be described.

Figure 15:
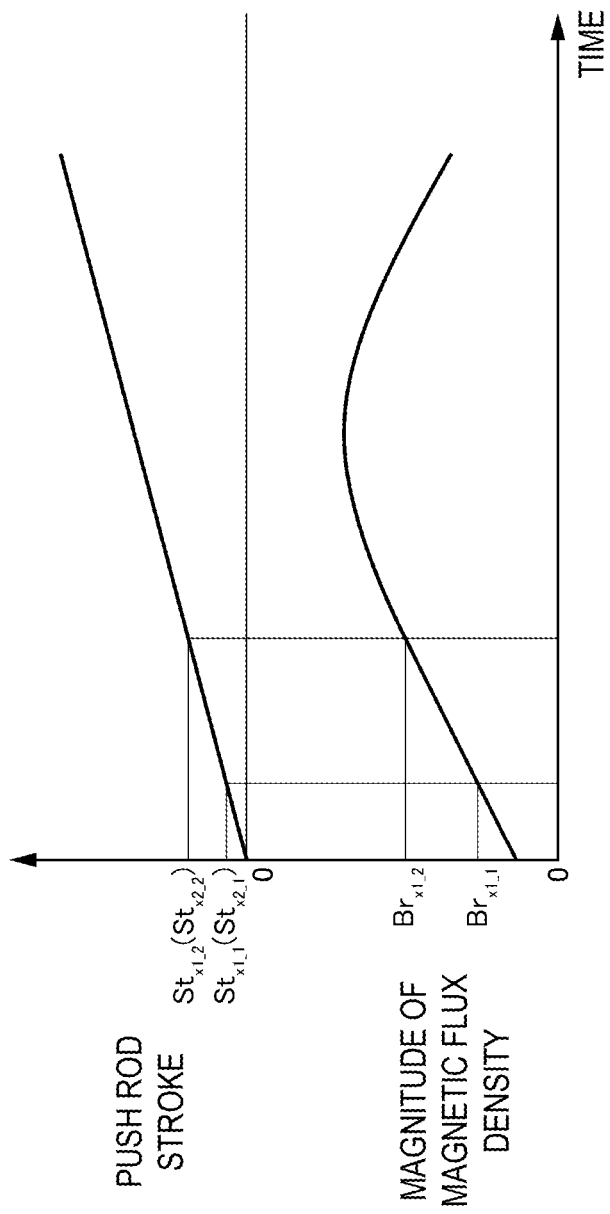
FIG. 15 is a timing chart of the stroke of the push rod 204 and the magnitude of the magnetic flux density when a driver presses a brake pedal 2.
Figure 16:
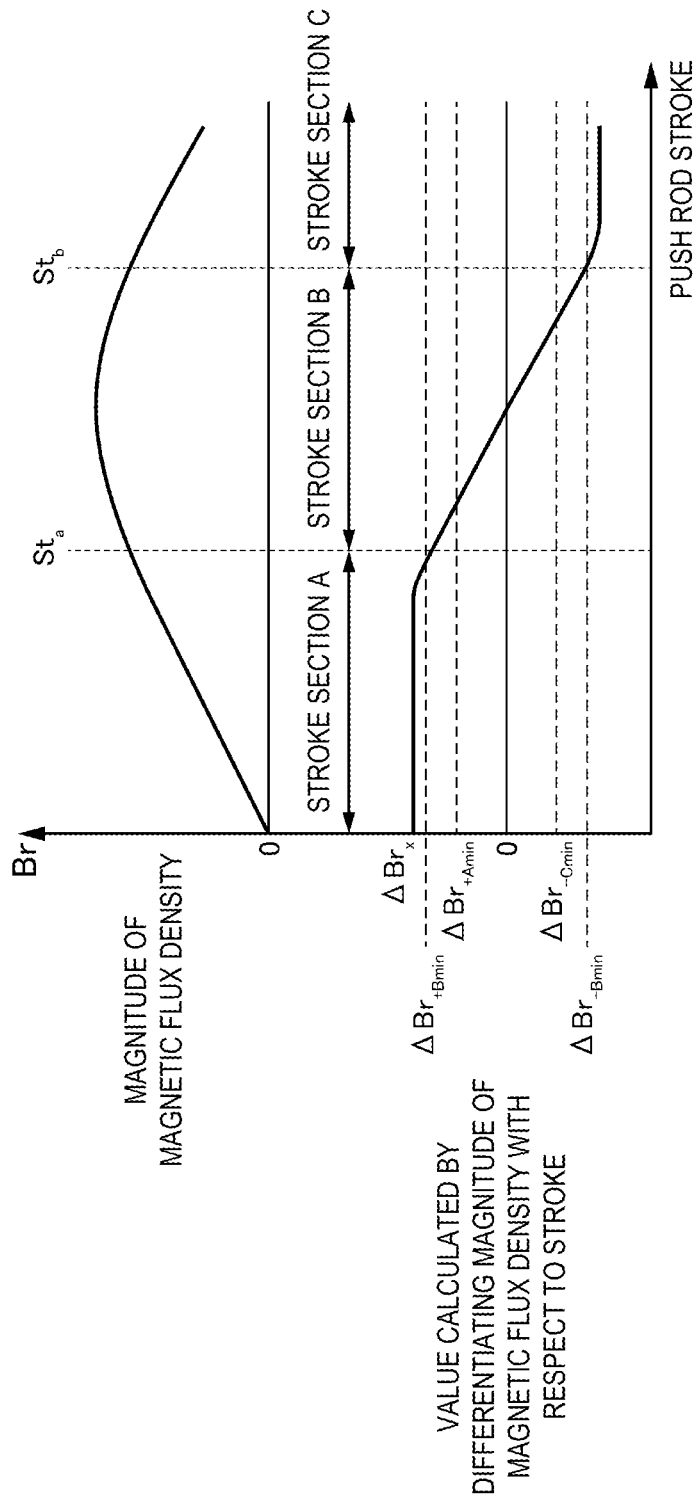
FIG. 16 illustrates the relationship between the magnitude of the magnetic flux density with respect to the stroke of the push rod 204 and a value acquired by differentiating the magnitude of the magnetic flux density with respect to the stroke.

FIG. 15 is a timing chart of the stroke of the push rod 204 and the magnitude of the magnetic flux density when the driver presses the brake pedal 2. The ECU 100 acquires the value calculated by differentiating the magnitude of the magnetic flux density with respect to the stroke ΔBrx{(Brx1_2−Brx1_1)/(Stx1_2−Stx1_1)} based on the magnitudes Brx1-2 and Brx1_1 of the magnetic flux densities when the stroke value is changed from Stx1_1 to Stx1_2. Subsequently, the ECU 100 determines which section contains the stroke values Stx1_1 and Stx1_2 in the stroke range of the push rod 204, and compares the preset standard value of the magnitude of the magnetic flux density expected in this stroke section and the value ΔBrx calculated by differentiating the magnitude of the magnetic flux density with respect to the stroke. FIG. 16 illustrates the relationship between the magnitude of the magnetic flux density with respect to the stroke of the push rod 204 and the value calculated by differentiating the magnitude of the magnetic flux density with respect to the stroke. In the second embodiment, the characteristic of the magnitude of the magnetic flux density detected by the Hall IC with respect to the stroke is set so as to become a curve convexed to the large side where the magnetic flux density is large.

When the position shift abnormality has occurred, the characteristic of the value ΔBrx calculated by differentiating, with respect to the stroke, the magnitude of the magnetic flux density with respect to the push rod stroke exhibits a characteristic deviating from the characteristic when the stroke sensor 90 is normal. Therefore, the position shift abnormality can be detected by comparing the standard value and ΔBrx. For example, when the stroke values Stx1_1 and Stx1_2 are located in the stroke section A, the value ΔBrx calculated by differentiating the magnitude of the magnetic flux density with respect to the stroke exhibits a value equal to or larger than the standard value ΔBr+Amin when the position shift abnormality has not occurred, and therefore the position shift abnormality can be determined to have occurred if ΔBrx is smaller than ΔBr+Amin. Further, in the second embodiment, comparing the magnetic flux density in terms of the change rate thereof can reduce incorrect detection due to sensor noise or the like and improve the accuracy of the determination about the position shift abnormality compared to when the magnetic flux density is compared in terms of the magnitude thereof.

In the second embodiment, when the stroke value Stx1_2 of the second point is not changed from the stroke value Stx1_1 of the first point, the position shift abnormality is determined based on the comparison between the difference Brx1−Brx2 between the magnitudes of the magnetic flux densities and the standard values Brtol_min and Brtol_max. In other words, when the value ΔBrx calculated by differentiating the magnitude of the magnetic flux density with respect to the stroke cannot be acquired, the position shift abnormality can be determined before the brake pedal 2 is operated by comparing the magnetic flux density in terms of the magnitude. Even when the stroke value Stx1_2 of the second point is changed from the stroke value Stx1_1 of the first point, the determination about the position shift abnormality is not made if the change amount is smaller than the threshold value Stwidth. As a result, this processing can prevent ΔBrx from becoming unable to be calculated due to an excessively narrow interval between the stroke values Stx1_1 and Stx1_2 of the two points.

The characteristic of the magnitude of the magnetic flux density detected by the Hall IC with respect to the stroke of the push rod 204 is set so as to be represented by the curved line convexed toward the large side where the magnetic flux density is large. Now, hypothetically supposing that the characteristic of the magnitude of the magnetic flux density with respect to the stroke is set to a characteristic proportional or inversely proportional to the stroke, the change rate of the magnitude of the magnetic flux density would be little changed with respect to a change in the stroke, and this would make the determination about the position shift abnormality difficult. On the other hand, the provision of inflexion points to the characteristic of the magnitude of the magnetic flux density with respect to the stroke allows the change rate of the magnitude of the magnetic flux density to be largely changed with respect to a change in the stroke, thereby allowing different standard values to be set for the respective stroke sections, and allowing the position shift abnormality to be determined high accurately.

Third Embodiment

Figure 17:
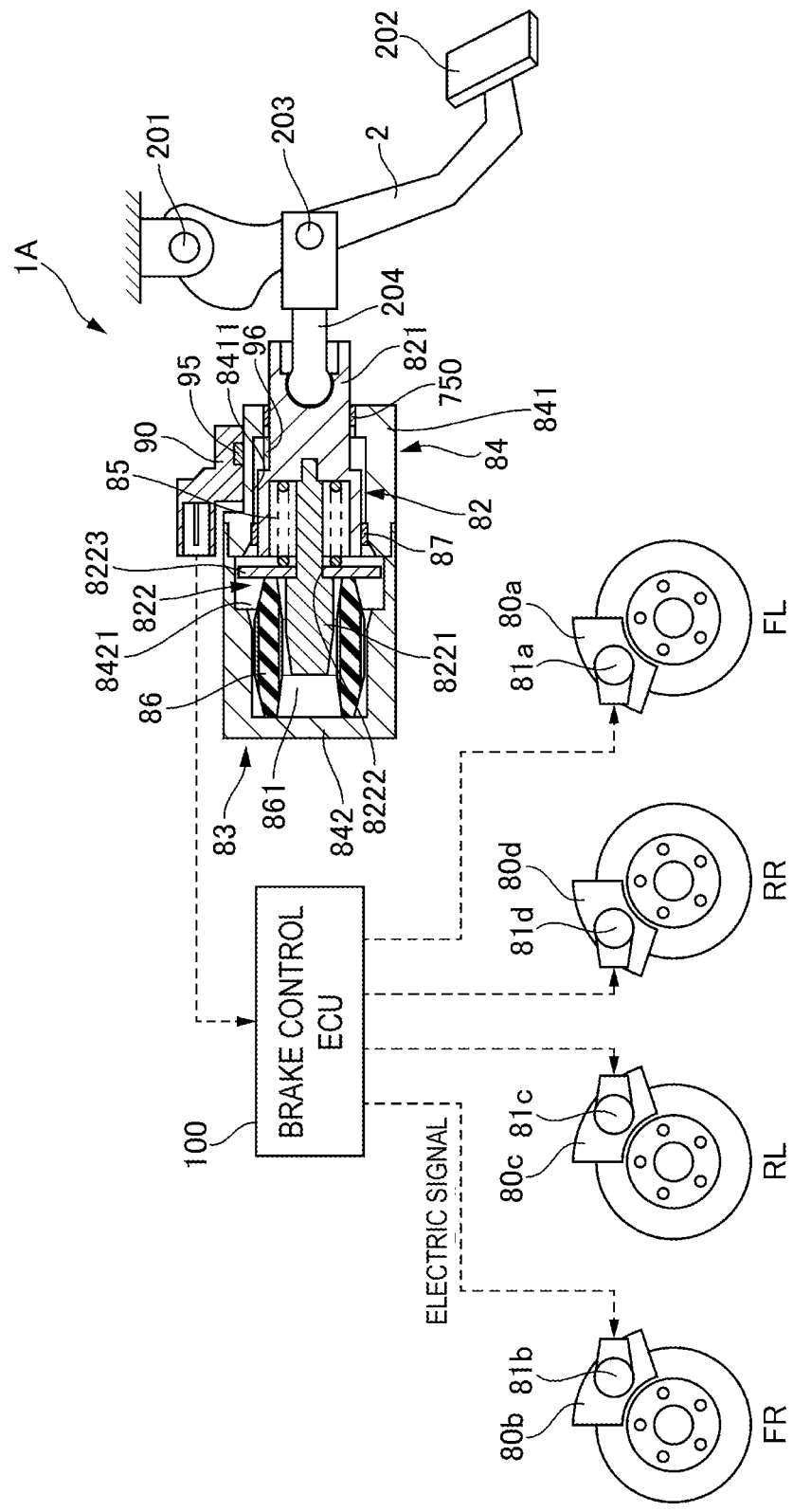
FIG. 17 schematically illustrates the configuration of a brake control apparatus 1A according to a third embodiment.

FIG. 17 schematically illustrates the configuration of a brake control apparatus 1A according to a third embodiment.

The brake control apparatus 1A is an electric brake control apparatus. A disk brake-type electric caliper 80 is provided on each of the wheels FL to RR. The ECU 100 actuates the electric caliper 80 to apply the braking force to each of the wheels FL to RR by rotationally driving an electric motor 81 based on a stroke of a piston main body 821 (the displacement amount of the push rod 204) detected by the stroke sensor 90. The stroke sensor 90 is configured similarly to the first embodiment. The push rod 204 is coupled with the piston main body 821. A stroke simulator 83 includes a cylinder 84, a piston 82, a spring 85, and a rubber damper 86. The cylinder 84 includes a cylinder main body 841 having a cylindrical inner peripheral surface, and a plug 842. The piston 82 includes the piston main body 821 and a stem 822. The spring 85 is a compression coil spring. The rubber damper 86 is a hollowly shaped elastic member made from rubber. The plug 842 is screwed in an opening end of the cylinder main body 841 and forms a part of the cylinder 84. The stem 822 includes a shaft member 8221 and a retainer 8223. The shaft member 8221 extends through a hole 8222 of the retainer 8223. The retainer 8223 is movable relative to the shaft member 8221 in the axial direction of the cylinder 84. The cylinder main body 841 includes a containing portion 8411, which contains the piston main body 821. The plug 842 includes a containing portion 8421, which contains the stem 822 and the rubber damper 86.

Two guide members (bushes, thrust bearings, or the like) 87, which smoothly support the axial movement of the piston, are mounted on the outer periphery of the piston 82. The guide members 87 are in contact with the inner peripheral surface of the containing portion 8411, and seal between the inner peripheral surface of the containing portion 8411 and the outer peripheral surface of the piston main body 821. The spring 85 biases the piston main body 821 toward the push rod 204. The spring 85 generates a reaction force according to the compression amount. The spring 85 is disposed between the piston main body 821 and the retainer 8223. The retainer 8223 subjected to the biasing force of the spring 85 is engaged with the shaft member 8221 fixed to the piston main body 821, thereby being restricted from moving more than that. The rubber damper 86 is inserted in the containing portion 8421 formed in the plug 842 in such a manner that the outer peripheral surface of the rubber damper 86 is in pressure contact with the inner peripheral surface of the containing portion 8421. The rubber damper 86 is disposed between the retainer 8223 of the stem 822 and the plug 842. The rubber damper 86 also generates a reaction force according to the compressed amount. The rubber damper 86 is positioned and held by being in pressure contact with the inner peripheral surface of the containing portion 8421. The outer peripheral surface of the shaft member 8221 inserted in a through-hole 861 of the rubber damper 86 is spaced apart from the inner peripheral surface of the through-hole 861 by a predetermined distance. Therefore, the spring 85 and the rubber damper 86 are disposed in series via the retainer 8223 between the piston main body 821 and the plug 842. The spring constant of the spring 85 is significantly small compared to the spring constant of the rubber damper 86. Due to this configuration, the stroke simulator 83 is actuated according to the driver's brake operation and applies a reaction force and a stroke to the brake pedal 2.

The ECU 100 performs the abnormality determination processing described in the first embodiment or the second embodiment on the stroke sensor 90. As a result, the position shift abnormality in the stroke sensor 90 can be detected, and advantageous effects similar to the first embodiment or the second embodiment can be achieved.

Fourth Embodiment

Figure 18:
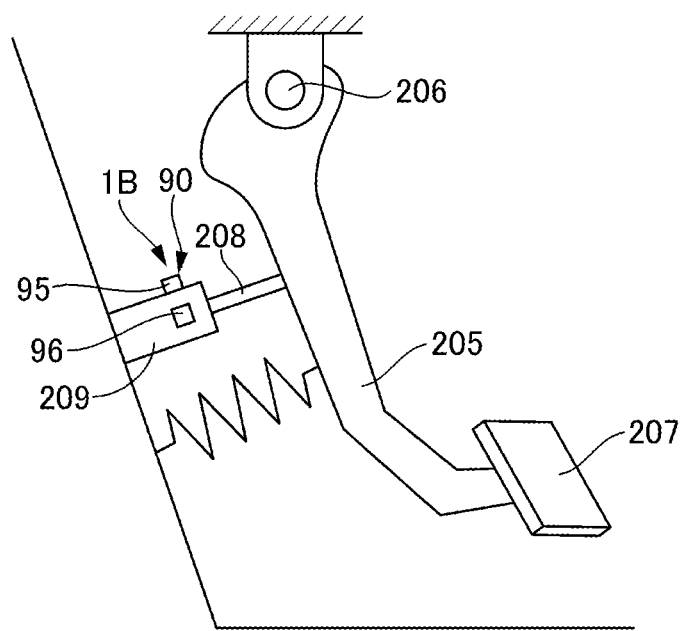
FIG. 18 schematically illustrates the configuration of a vehicle pedal stroke detection apparatus 1B according to a fourth embodiment.

FIG. 18 schematically illustrates the configuration of a vehicle pedal stroke detection apparatus 1B according to a fourth embodiment.

An accelerator pedal 205 is an acceleration operation member that receives an input of the driver's acceleration operation. The accelerator pedal 205 is a so-called suspended-type pedal, and the proximal end thereof is rotatably supported via a shaft 206. A pedal pad 207, which serves as a target that the driver presses, is provided at the distal end of the accelerator pedal 205. One end of a push rod (a rod) 208 is connected between the shaft 206 and the pedal pad 207 of the accelerator pedal 205. The other end of the push rod 208 is connected to one end of a not-illustrated piston axially movable inside a cylinder 209. The stroke sensor 90 is provided to the cylinder 209. The stroke sensor 90 outputs a sensor signal according to a movement amount (a stroke) of the piston to a not-illustrated engine control unit as a physical amount correlated to a displacement amount (an accelerator stroke) of the accelerator pedal 205 (the push rod 208). The stroke sensor 90 is configured similarly to the first embodiment.

The engine control unit performs the abnormality determination processing described in the first embodiment or the second embodiment on the stroke sensor 90. As a result, the position shift abnormality in the stroke sensor 90 can be detected, and advantageous effects similar to the first embodiment or the second embodiment can be achieved.

Other Embodiments

Having described the embodiments for implementing the present invention, the specific configuration of the present invention is not limited to the configurations of the embodiments, and the present invention also includes even a design modification and the like thereof made within a range that does not depart from the spirit of the present invention, if any.

For example, the physical amount regarding the magnitude of the magnetic flux density detected by the stroke sensor is not limited to the magnitude of the magnetic flux density and the change rate thereof.

The layout, the shapes, and the numbers of the magnet and the Hall IC are not limited to the embodiments. For example, the stroke sensor may be configured in such a manner that the magnet is arranged in parallel with the piston as discussed in International Publication No. 2009/129887, besides the configuration in which the magnet is arranged on the piston like the stroke sensor discussed in US Patent Application Publication No. 2004/0020201

In the second embodiment, the characteristic of the magnitude of the magnetic flux density detected by the Hall IC with respect to the stroke of the push rod 204 may be set to the characteristic of the standard central value with respect to the stroke illustrated in FIG. 7. This setting can increase the number of inflexion points and increase the stroke sections and the standard values, thereby allowing the position shift abnormality to be further highly accurately determined. A plurality of magnets may be mounted when increasing the inflexion points.

In the following description, technical ideas recognizable from the above-described embodiments will be described.

A vehicle pedal stroke detection apparatus, according to one configuration thereof, includes a magnet configured to be displaced in an axial direction according to a movement of a rod moving in the axial direction based on an operation on a pedal, a stroke sensor configured to detect a physical amount regarding a magnetic flux of the magnet, and a control unit. The control unit acquires the physical amount regarding the magnetic flux of the magnet that is output from the stroke sensor, and acquires a first value based on the acquired physical amount regarding the magnetic flux of the magnet. The first value is a physical amount regarding a magnitude of a magnetic flux density of the magnet with respect to the displacement of the rod. Then, the control unit compares the first value and a second value. The second value is a physical amount regarding the magnitude of the magnetic flux density of the magnet with respect to the displacement of the rod, the magnitude of the magnetic flux density of the magnet with respect to the displacement of the rod being preset.

According to a further preferable configuration, in the above-described configuration, the control unit determines an abnormality regarding the displacement of the rod based on the comparison between the first value and the second value.

According to another preferable configuration, in any of the above-described configurations, the first value is the acquired magnitude of the magnetic flux density of the magnet. The second value is the preset magnitude of the magnetic flux density of the magnet with respect to the displacement of the rod.

According to further another preferable configuration, in any of the above-described configurations, the control unit determines the abnormality regarding the displacement of the rod based on whether the first value falls within a predetermined range containing the second value.

According to further another preferable configuration, in any of the above-described configurations, the control unit acquires the second value based on the preset magnitude of the magnetic flux density of the magnet corresponding to a stroke initial value of the rod.

According to further another preferable configuration, in any of the above-described configurations, the control unit determines an abnormality in the magnitude of the magnetic flux density of the magnet corresponding to the stroke initial value based on whether the first value corresponding to the stroke initial value falls within the predetermined range.

According to further another preferable configuration, in any of the above-described configurations, the control unit determines the abnormality regarding the displacement of the rod when the pedal is in a non-operated state.

According to further another preferable configuration, in any of the above-described configurations, the first value is a change rate of the acquired magnitude of the magnetic flux density of the magnet. The second value is a change rate of the preset magnitude of the magnetic flux density of the magnet with respect to the displacement of the rod.

According to further another preferable configuration, in any of the above-described configurations, the control unit determines the abnormality regarding the displacement of the rod based on the comparison between the acquired magnitude of the magnetic flux density of the magnet and the preset magnitude of the magnetic flux density of the magnet with respect to the displacement of the rod when the first value cannot be acquired.

According to further another preferable configuration, in any of the above-described configurations, the preset magnetic flux density of the magnet with respect to the displacement of the rod has a characteristic convexed toward a large side where the magnitude of the magnetic flux density is large or convexed toward a small side where the magnitude of the magnetic flux density is small.

According to further another preferable configuration, in any of the above-described configurations, the stroke sensor is a sensor that outputs two values. The control unit determines an abnormality in the stroke sensor based on a difference between the two output values.

According to further another preferable configuration, in any of the above-described configurations, the pedal is a brake pedal.

According to further another preferable configuration, in any of the above-described configurations, the vehicle pedal stroke detection apparatus further includes a connection fluid passage. The connection fluid passage connects a master cylinder including a piston connected to the rod and a cylinder in which the piston is disposed, and a braking force application portion configured to apply a braking force to a wheel according to a brake hydraulic pressure. The vehicle pedal stroke detection apparatus further includes a shut-off valve provided in the connection fluid passage, and a hydraulic pressure source configured to supply brake fluid to a fluid passage in the connection fluid passage that is located between the shut-off valve and the braking force application portion.

Further, from another aspect, a vehicle control unit acquires a physical amount regarding a magnetic flux of a magnet that is output from a stroke sensor configured to detect the physical amount regarding the magnetic flux of the magnet displacing in an axial direction according to a movement of a rod moving in the axial direction based on an operation on a pedal. The vehicle control unit acquire a first value based on the acquired physical amount regarding the magnetic flux of the magnet. The first value is a physical amount regarding a magnitude of a magnetic flux density of the magnet with respect to the displacement of the rod. The vehicle control unit compares the first value and a second value. The second value is a physical amount regarding the magnitude of the magnetic flux density of the magnet with respect to the displacement of the rod, the magnitude of the magnetic flux density of the magnet with respect to the displacement of the rod being preset.

Preferably, in the above-described configuration, the vehicle control unit determines an abnormality regarding the displacement of the rod based on the comparison between the first value and the second value.

The present invention shall not be limited to the above-described embodiments, and includes various modifications. For example, the above-described embodiments have been described in detail to facilitate a better understanding of the present invention, and the present invention shall not necessarily be limited to the configuration including all of the described features. Further, a part of the configuration of some embodiment can be replaced with the configuration of another embodiment. Further, some embodiment can also be implemented with a configuration of another embodiment added to the configuration of this embodiment. Further, each of embodiments can also be implemented with another configuration added, deleted, or replaced with respect to a part of the configuration of this embodiment.

The present application claims priority under the Paris Convention to Japanese Patent Application No. 2018-226677 filed on Dec. 3, 2018. The entire disclosure of Japanese Patent Application No. 2018-226677 filed on Dec. 3, 2018 including the specification, the claims, the drawings, and the abstract is incorporated herein by reference in its entirety.

REFERENCE SIGNS LIST

FL to RR wheel
1 brake control apparatus
2 brake pedal
3 master cylinder
7 pump (hydraulic pressure source)
8 wheel cylinder (braking force application portion)
11 first fluid passage (connection fluid passage)
21 shut-off valve
30 cylinder
32 piston
90 stroke sensor
96 magnet
100 ECU (control unit)
204 push rod (rod)

The invention claimed is:

1. A vehicle pedal stroke detection apparatus comprising:
a magnet configured to be displaced in an axial direction according to a movement of a rod that moves in the axial direction based on an operation on a pedal;
a stroke sensor configured to detect a physical amount regarding a magnetic flux of the magnet; and
a control unit,
wherein the control unit
acquires the physical amount regarding the magnetic flux of the magnet that is output from the stroke sensor, and acquires a first value based on the acquired physical amount regarding the magnetic flux of the magnet, the first value being a physical amount regarding a magnitude of a magnetic flux density of the magnet with respect to the displacement of the rod, and
compares the first value and a second value, the second value being a physical amount regarding the magnitude of the magnetic flux density of the magnet with respect to the displacement of the rod, the magnitude of the magnetic flux density of the magnet with respect to the displacement of the rod for the second value being preset.

2. The vehicle pedal stroke detection apparatus according to claim 1, wherein the control unit determines an abnormality regarding the displacement of the rod based on the comparison between the first value and the second value.

3. The vehicle pedal stroke detection apparatus according to claim 2, wherein the first value is the acquired magnitude of the magnetic flux density of the magnet, and
wherein the second value is the preset magnitude of the magnetic flux density of the magnet with respect to the displacement of the rod.

4. The vehicle pedal stroke detection apparatus according to claim 3, wherein the control unit determines the abnormality regarding the displacement of the rod based on whether the first value falls within a predetermined range containing the second value.

5. The vehicle pedal stroke detection apparatus according to claim 4, wherein the control unit acquires the second value based on the preset magnitude of the magnetic flux density of the magnet corresponding to a stroke initial value of the rod.

6. The vehicle pedal stroke detection apparatus according to claim 5, wherein the control unit determines an abnormality in the magnitude of the magnetic flux density of the magnet corresponding to the stroke initial value based on whether the first value corresponding to the stroke initial value falls within the predetermined range.

7. The vehicle pedal stroke detection apparatus according to claim 3, wherein the control unit determines the abnormality regarding the displacement of the rod when the pedal is in a non-operated state.

8. The vehicle pedal stroke detection apparatus according to claim 2, wherein the first value is a change rate of the acquired magnitude of the magnetic flux density of the magnet, and
wherein the second value is a change rate of the preset magnitude of the magnetic flux density of the magnet with respect to the displacement of the rod.

9. The vehicle pedal stroke detection apparatus according to claim 8, wherein the control unit determines the abnormality regarding the displacement of the rod based on the comparison between the acquired magnitude of the magnetic flux density of the magnet and the preset magnitude of the magnetic flux density of the magnet with respect to the displacement of the rod when the first value cannot be acquired.

10. The vehicle pedal stroke detection apparatus according to claim 8, wherein the preset magnetic flux density of the magnet with respect to the displacement of the rod has a characteristic convexed toward a large side where the magnitude of the magnetic flux density is large or convexed toward a small side where the magnitude of the magnetic flux density is small.

11. The vehicle pedal stroke detection apparatus according to claim 2, wherein the stroke sensor is a sensor that outputs two values, and
wherein the control unit determines an abnormality in the stroke sensor based on a difference between the two output values.

12. The vehicle pedal stroke detection apparatus according to claim 1, wherein the pedal is a brake pedal.

13. The vehicle pedal stroke detection apparatus according to claim 12, further comprising:
a connection fluid passage, the connection fluid passage connecting a master cylinder including a piston connected to the rod and a cylinder in which the piston is disposed, and a braking force application portion configured to apply a braking force to a wheel according to a brake hydraulic pressure,
the vehicle pedal stroke detection apparatus further comprising:
a shut-off valve provided in the connection fluid passage; and
a hydraulic pressure source configured to supply brake fluid to a fluid passage in the connection fluid passage that is located between the shut-off valve and the braking force application portion.

14. A vehicle control unit, the vehicle control unit being configured to
acquire a physical amount regarding a magnetic flux of a magnet that is output from a stroke sensor configured to detect the physical amount regarding the magnetic flux of the magnet displacing in an axial direction according to a movement of a rod moving in the axial direction based on an operation on a pedal, and
acquire a first value based on the acquired physical amount regarding the magnetic flux of the magnet, the first value being a physical amount regarding a magnitude of a magnetic flux density of the magnet with respect to the displacement of the rod, and compare the first value and a second value, the second value being a physical amount regarding the magnitude of the magnetic flux density of the magnet with respect to the displacement of the rod, the magnitude of the magnetic flux density of the magnet with respect to the displacement of the rod for the second value being preset.

15. The vehicle control unit according to claim 14, wherein the vehicle control unit determines an abnormality regarding the displacement of the rod based on the comparison between the first value and the second value.

* * * * *